United States Patent
Seol et al.

(10) Patent No.: US 12,356,668 B2
(45) Date of Patent: *Jul. 8, 2025

(54) FIELD EFFECT TRANSISTOR INCLUDING CHANNELS HAVING A HOLLOW CLOSED CROSS-SECTIONAL STRUCTURE AND METHOD OF MANUFACTURING THE SAME

(71) Applicant: Samsung Electronics Co., Ltd., Suwon-si (KR)

(72) Inventors: Minsu Seol, Seoul (KR); Minhyun Lee, Suwon-si (KR); Junyoung Kwon, Seoul (KR); Hyeonjin Shin, Suwon-si (KR); Minseok Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/441,520

(22) Filed: Feb. 14, 2024

(65) Prior Publication Data
US 2024/0186183 A1 Jun. 6, 2024

Related U.S. Application Data

(63) Continuation of application No. 17/370,480, filed on Jul. 8, 2021, now Pat. No. 11,935,790.

(30) Foreign Application Priority Data

Sep. 4, 2020 (KR) ........................ 10-2020-0113205

(51) Int. Cl.
*H10D 30/67* (2025.01)
*H01L 21/02* (2006.01)
(Continued)

(52) U.S. Cl.
CPC ... *H10D 30/6735* (2025.01); *H01L 21/02521* (2013.01); *H01L 21/02527* (2013.01);
(Continued)

(58) Field of Classification Search
CPC ......... H01L 21/02521; H01L 21/02537; H01L 21/02568; H01L 21/0257; H01L 21/0259;
(Continued)

(56) References Cited

U.S. PATENT DOCUMENTS 7,402,483 B2 7/2008 Yun et al.
7,427,788 B2 9/2008 Li et al.
(Continued)

FOREIGN PATENT DOCUMENTS

KR 2006/0011320 A 2/2006
KR 10-2006-0037561 A 5/2006
(Continued)

OTHER PUBLICATIONS

Deji Akinwande et al., 'Graphene and two-dimensional materials for silicon technology' *Nature*, vol. 573, Sep. 2019, pp. 507-518.
(Continued)

*Primary Examiner* — Cheung Lee
(74) *Attorney, Agent, or Firm* — HARNESS, DICKEY & PIERCE, P.L.C.

(57) ABSTRACT

Disclosed are a field effect transistor and a method of manufacturing the same. The field effect transistor includes a source electrode on a substrate, a drain electrode separated from the source electrode, and channels connected between the source electrode and the drain electrode, gate insulating layers, and a gate electrode. The channels may have a hollow closed cross-sectional structure when viewed in a first cross-section formed by a plane across the source electrode and the drain electrode in a direction perpendicular to the substrate. The gate insulating layers may be in the channels.
(Continued)

The gate electrode may be insulated from the source electrode and the drain electrode by the gate insulating layers.

19 Claims, 22 Drawing Sheets

(51) Int. Cl.
*H10D 30/01* (2025.01)
*H10D 48/36* (2025.01)
*H10D 62/10* (2025.01)
*H10D 62/80* (2025.01)
*H10D 62/83* (2025.01)
*H10D 84/01* (2025.01)
*H10D 84/03* (2025.01)
*H10D 99/00* (2025.01)

(52) U.S. Cl.
CPC .... *H01L 21/02568* (2013.01); *H01L 21/0259* (2013.01); *H10D 30/01* (2025.01); *H10D 30/6757* (2025.01); *H10D 48/362* (2025.01); *H10D 62/118* (2025.01); *H10D 62/80* (2025.01); *H10D 62/8303* (2025.01); *H10D 62/882* (2025.01); *H10D 84/0128* (2025.01); *H10D 84/0158* (2025.01); *H10D 84/038* (2025.01); *H10D 99/00* (2025.01)

(58) Field of Classification Search
CPC ..... H01L 21/823412; H01L 21/823431; H01L 21/02527; H01L 29/06654; H01L 29/0673; H01L 29/1033; H01L 29/1606; H01L 29/24; H01L 29/42392; H01L 29/66045; H01L 29/66742; H01L 29/66772; H01L 29/66969; H01L 29/7606; H01L 29/778; H01L 29/786; H01L 29/78654; H01L 29/78696; H10D 30/501–509; H10D 30/6735; H10D 30/674; H10D 30/6757; H10D 84/01; H10D 84/0128; H10D 84/038
See application file for complete search history.

(56) References Cited

U.S. PATENT DOCUMENTS

| | | | |
|---|---|---|---|
| 7,648,883 | B2 | 1/2010 | Park |
| 7,947,590 | B2 | 5/2011 | Park et al. |
| 9,240,478 | B2 | 1/2016 | Chang et al. |
| 9,711,647 | B2 | 7/2017 | van Dal et al. |
| 10,388,732 | B1 | 8/2019 | Frougier et al. |
| 2007/0161168 | A1 | 7/2007 | Yun et al. |
| 2016/0141427 | A1 | 5/2016 | Chen et al. |
| 2020/0075599 | A1 | 3/2020 | Hashemi et al. |
| 2021/0296445 | A1 | 9/2021 | Lee et al. |

FOREIGN PATENT DOCUMENTS

| | | |
|---|---|---|
| KR | 2006/0062725 A | 6/2006 |
| KR | 100625177 B1 | 9/2006 |
| KR | 100785039 B1 | 12/2007 |
| KR | 101880471 B1 | 7/2018 |

OTHER PUBLICATIONS

Sung-Young Lee et al., 'A Novel Multibridge-Channel Mosfet (MBCFET): Fabrication Technologies and Characteristics' *IEEE Transactions on Nanotechnology*, vol. 2, No. 4, Dec. 2003, pp. 253-257.

Yuan Liu et al., 'Two-dimensional transistors beyond graphene and TMDCs' *Chem. Soc. Rev.*, vol. 47, 2018, pp. 6388-6409.

Gangtae Jin et al., 'Atomically thin three-dimensional membranes of van der Waals semiconductors by wafer-scale growth' *Science Advances*, vol. 5, Jul. 2019.

Extended European Search Report dated Feb. 2, 2022, issued in corresponding European Patent Application No. 21190601.1.

<A-A>

<B-B>

FIELD EFFECT TRANSISTOR INCLUDING CHANNELS HAVING A HOLLOW CLOSED CROSS-SECTIONAL STRUCTURE AND METHOD OF MANUFACTURING THE SAME

CROSS-REFERENCE TO RELATED APPLICATION

This application is a continuation of U.S. patent application Ser. No. 17/370,480, filed on Jul. 8, 2021, which is based on and claims priority under 35 U.S.C. § 119 to Korean Patent Application No. 10-2020-0113205, filed on Sep. 4, 2020, in the Korean Intellectual Property Office, the disclosure of which is incorporated by reference herein in its entirety.

BACKGROUND

1. Field

The present disclosure relates to a field effect transistor including a multi-bridge channel configuration and a method of manufacturing the field effect transistor.

2. Description of the Related Art

Transistors, which are semiconductor devices performing an electrical switching function, have been used for various integrated circuit devices including memories, driving integrated circuits (ICs), logic devices, etc. In order to increase the degree of integration of an integrated circuit device, a space for a transistor included therein has been rapidly reduced, and thus, research for maintaining the performance of the transistor while reducing the size of the transistor has been conducted.

One of the important parts of the transistor is a gate electrode. When a voltage is applied to the gate electrode, a channel adjacent to a gate opens a current path, and blocks the current in an opposite direction. The performance of a semiconductor depends on how much a leakage current is reduced and efficiently managed in the gate electrode and the channel. Power efficiency increases as a contact area between the gate electrode controlling the current in the transistor and the channel increases.

As semiconductor processes become more sophisticated, the size of transistor is decreased, and thus, the contact area between the gate electrode and the channel is also decreased, which causes problems due to a short channel effect. For example, phenomena such as a threshold voltage variation, a carrier velocity saturation, deterioration of the subthreshold characteristics, etc. may occur. Accordingly, a method to overcome the short channel effect and effectively reduce a channel length has been sought.

SUMMARY

Provided is a field effect transistor including a multi-bridge channel configuration.

Provided is an electronic device including a field effect transistor including the multi-bridge channel configuration.

Provided is a method of manufacturing a field effect transistor including a multi-bridge channel configuration.

Additional aspects will be set forth in part in the description which follows and, in part, will be apparent from the description, or may be learned by practice of the presented embodiments of the disclosure.

According to an embodiment, a field effect transistor includes a substrate; a source electrode on a substrate; a drain electrode separated from the source electrode; channels connected between the source electrode and the drain electrode, the channels having a hollow closed cross-sectional structure when viewed in a first cross-section formed by a plane across the source electrode and the drain electrode in a direction perpendicular to the substrate; gate insulating layers in the channels; and a gate electrode insulated from the source electrode and the drain electrode by the gate insulating layers.

In some embodiments, at least one of the channels may include a two-dimensional semiconductor material.

In some embodiments, the two-dimensional semiconductor material may include graphene, black phosphorus, phosphor, or transition metal dichalcogenide.

In some embodiments, the transition metal dichalcogenide may include a metal element and a chalcogen element. The metal may include one of Mo, W, Nb, V, Ta, Ti, Zr, Hf, Tc, Re, Cu, Ga, In, Sn, Ge, and Pb. The chalcogen element may include one of S, Se, and Te.

In some embodiments, the two-dimensional semiconductor material may be doped with a conductive dopant.

In some embodiments, the channels may directly contact the source electrode and the drain electrode.

In some embodiments, an insulating layer may be further arranged between the channels adjacent to each other.

In some embodiments, the insulating layer may cross an area (e.g., extend) between the source electrode and the drain electrode.

In some embodiments, the insulating layer may include at least one of low-doped silicon, $SiO_2$, $Al_2O_3$, $HfO_2$, or $Si_3N_4$.

In some embodiments, the channels may be separated from each other in the direction perpendicular to the substrate.

In some embodiments, a region between the channels adjacent to each other may be an empty space.

In some embodiments, a thickness of a sheet portion of at least one of the channels may be about 10 nm or less.

In some embodiments, the gate electrode may surround all sides of the channels when viewed in a second cross-section formed by a plane between the source electrode and the drain electrode in the direction perpendicular to the substrate.

In some embodiments, the channels may have the hollow closed cross-sectional structure when viewed in a second cross-section formed by a plane between the source electrode and the drain electrode in the direction perpendicular to the substrate. The gate electrode may be in the channel, when viewed in the first cross-section.

According to an embodiment, a method of manufacturing a field effect transistor includes alternately stacking sacrificial layers and insulating layers on a substrate to provide a stack structure; patterning the stack structure using a mask to provide a patterned stack structure; forming a source electrode and a drain electrode on both sides of the patterned stack structure; removing the sacrificial layers, the removing the sacrificial layers leaving the insulating layers suspended between the source electrode and the drain electrode and separated from each other in a direction perpendicular to the substrate; forming channels by depositing a channel material on the insulating layers; depositing a gate insulating layer on the channels; and depositing a gate electrode on the gate insulating layer.

According to an embodiment, a method of manufacturing a field effect transistor includes alternately stacking sacrificial layers and gate electrodes on a substrate to provide a stack structure; patterning the stack structure using a mask to provide a patterned stack structure; forming gate support electrodes on both sides of the patterned stack structure, the gate support electrodes being connected to the gate electrodes; removing the sacrificial layers, the removing the sacrificial layers leaving the gate electrodes suspended between the gate support electrodes and separated from each other in a direction perpendicular to the substrate; depositing a gate insulating layer on the gate electrode; forming channels by depositing a channel material on the gate insulating layers; and depositing a source electrode and a drain electrode, the source electrode and the drain electrode being connected to the channels.

According to an embodiment, a field effect transistor includes a substrate; a source electrode on the substrate; a drain electrode separated from the source electrode; a gate electrode on the substrate between the source electrode and the drain electrode; a plurality of channels on the substrate between the source electrode and the drain electrode, the plurality of channels including first channels spaced apart from each other in a vertical direction, each of the first channels having a hollow cross-section; and a gate insulating layer connected to the gate electrode and the plurality of channels, the gate insulating layer insulating the gate electrode from the source electrode, the plurality of channels, and the drain electrode.

In some embodiments, the plurality of channels may include a second channel over the first channels. The second channel may be spaced apart from the first channels. The second channel may be between the source electrode and the drain electrode. The gate insulating layer may insulate the gate electrode from the second channel.

In some embodiments, at least one of the channels may include a two-dimensional semiconductor material, and the first channels may directly contact the source electrode and the drain electrode.

In some embodiments, an insulating layer may be between the first channels adjacent to each other.

In some embodiments, a region between the first channels adjacent to each other may be an empty space.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
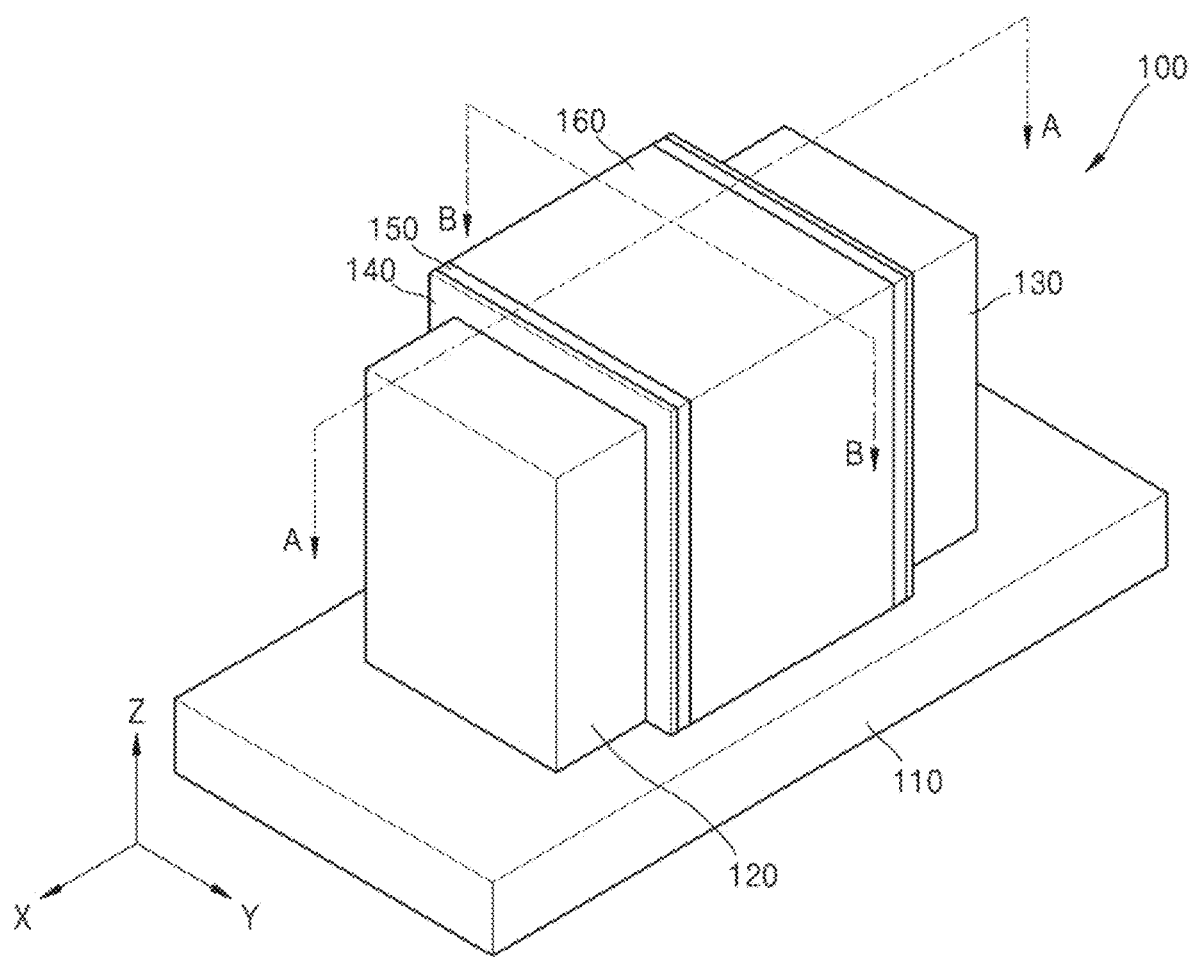
FIG. 1 is a perspective view of a field effect transistor according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term and/or "includes any and all combinations of one or more of the associated listed items."

Expressions such as at least one of, "when preceding a list of elements, modify the entire list of elements and do not modify the individual elements of the list." For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, a field effect transistor according to various embodiments and a method of manufacturing the field effect transistor will be described in detail with reference to the accompanying drawings. In the following drawings, like reference numerals denote like elements, and the size of each element may be exaggerated for clarity and convenience of description. Terms such as "first" and "second" may be used to describe various elements, but the elements should not be limited by the terms. The terms are used only to distinguish one element from another element.

Singular expressions may include the meaning of plural expressions as long as there is no definite difference therebetween in the context. In addition, when an element is referred to as "including" a constituent element, other constituent elements may be further included not excluded unless there is any other particular mention on it. In addition, in the drawings, the size or thickness of each element may be exaggerated for clarity of description. Also, it will also be understood that when a material layer is referred to as being "on" another substrate or layer, it can be directly on the other substrate or layer, or intervening layers may also be present. In addition, materials constituting each layer in the embodiments below are non-limiting examples, and other materials than the described ones may also be used.

Terms such as "unit" and "module" denote units that process at least one function or operation, and they may be implemented by using hardware, software, or a combination of hardware and software.

The particular implementations shown and described herein are examples of the present disclosure and are not intended to otherwise limit the scope of the present disclosure in any way. For the sake of brevity, conventional electronics, control systems, software and other functional aspects of the systems may not be described in detail. Furthermore, line connections or connection members between elements depicted in the drawings represent functional connections and/or physical or circuit connections by way of example, and in actual applications, they may be replaced or embodied with various suitable additional functional connections, physical connections, or circuit connections.

The term "the" and other demonstratives similar thereto should be understood to include a singular form and plural forms.

Operations of a method may be performed in appropriate order unless explicitly described in terms of order or described to the contrary. In addition, examples or example terms (for example, "such as" and "etc.") are used for the purpose of description and are not intended to limit the scope of the present disclosure unless defined by the claims.

FIG. 1 is a perspective view of a field effect transistor according to an example embodiment.

A field effect transistor 100 may include a substrate 110, a source electrode 120 arranged on the substrate 110, a drain electrode 130 separated from the source electrode 120, channels 140 connected between the source electrode 120 and the drain electrode 130, and a gate electrode 160 insulated from the source electrode 120 and the drain electrode 130.

The substrate 110 may be an insulating substrate or a semiconductor substrate having an insulating layer formed thereon. The semiconductor substrate may include, for example, Si, Ge, SiGe or a group III-V semiconductor material. The substrate 110 may be, for example, a silicon substrate in which silicon oxide is formed on a surface thereof, but is not limited thereto.

Figure 2:
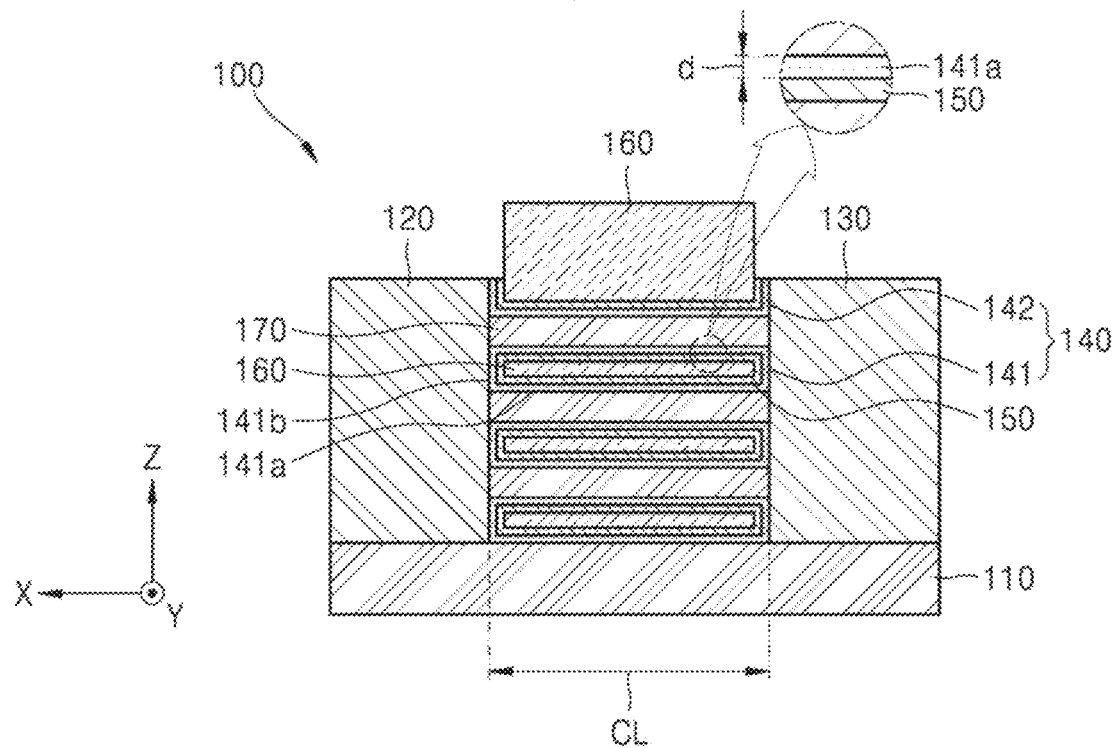
FIG. 2 is a cross-sectional view taken along line A-A of FIG. 1.
Figure 3:
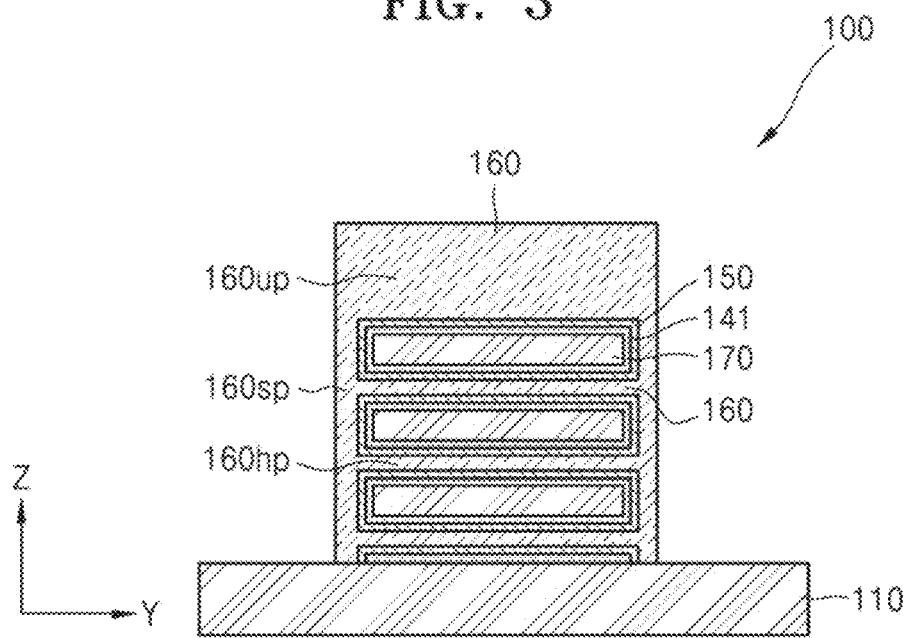
FIG. 3 is a cross-sectional view taken along line B-B of FIG. 1.

FIG. 2 is a cross-sectional view taken along line A-A of the field effect transistor of FIG. 1, and FIG. 3 is a cross-sectional view taken along line B-B of the field effect transistor of FIG. 1. The A-A cross-section may be a first cross-section formed by a plane across the source electrode 120 and the drain electrode 130 (X direction in the drawing), in a direction (Z direction in the drawing) perpendicular to the substrate 100. The B-B cross-section may be a second cross-section formed by a plane between the source electrode 120 and the drain electrode 130 (Y direction in the drawing), in a direction (Z direction in the drawing) perpendicular to the substrate 100. Here, because the substrate 100 may not be a complete plane, the direction perpendicular to the substrate 100 may be substantially perpendicular to the substrate 100. Throughout the present specification, the above-described direction will be applied to both the first cross-section and the second cross-section.

Referring to FIG. 2, the channels 140 may include a first channel 141 having a hollow closed cross-sectional structure when viewed in the first cross-section. The hollow closed cross-sectional structure may include, for example, a closed loop shape including a square, a circle, an oval, or an arbitrary figure. The first channel 141 may include, for example, a sheet portion 141a connected across the source electrode 120 and the drain electrode 130, and a contact portion 141b contacting the source electrode 120 and the drain electrode 130. The first channel 141 may include two sheet portions 141a. The contact portion 141b may support the two sheet portions 141a and define a gap between the two sheet portions 141a.

A plurality of first channels 141 may be arranged, and the first channels 141 may be separated from each other in the direction (Z direction) perpendicular to the substrate 110. In other words, the first channels 141 adjacent to each other may be separated from each other. Meanwhile, the channels 140 may include a second channel 142 in which at least one of an upper end and a lower end thereof has an open cross-sectional structure or a sheet-shaped structure when viewed in the first cross-section. The channels 140 may be connected between the source electrode 120 and the drain electrode 130 to serve as a path through which current flows between the source electrode 120 and the drain electrode 130. The channels 140 may directly contact the source electrode 120 and the drain electrode 130. However, the channels 140 are not limited thereto, and the channels 140 may be connected to the source electrode 120 and the drain electrode 130 through a medium.

In the case where the first channel 141 has the hollow closed cross-sectional structure, the first channel 141 may be in surface contact with the source electrode 120 and the drain electrode 130, and contact areas may be increased by adjusting a thickness of the hollow of the first channel 141. That is, the contact area between the first channel 141 and the source electrode 120 and the contact area between the first channel 141 and the drain electrode 130 may be adjusted by adjusting a length of the spacer portion 141b of the first channel 141. For example, the spacer portion 141b may have a length of 100 nm or less. Alternatively, the spacer portion 141b may have a length of 50 nm or less. Alternatively, the spacer portion 141b may have a length of 20 nm or less. Alternatively, the spacer portion 141b may have a length of 10 nm or less.

The first channel 141 and the second channel 142 may include a two-dimensional semiconductor material. The two-dimensional semiconductor material may include graphene, black phosphorus, phosphorene, or transition metal dichalcogenide. The transition metal dichalcogenide may include any one metal element selected from the group consisting of Mo, W, Nb, V, Ta, Ti, Zr, Hf, Tc, Re, Cu, Ga, In, Sn, Ge, and Pb, and any one chalcogen element selected from the group consisting of S, Se, and Te.

The two-dimensional semiconductor material may be doped with a conductive dopant.

For example, in the first channel 141, a thickness d of the sheet portion 141a connected between the source electrode 120 and the drain electrode 130 may be 20 nm or less. For example, the thickness d of the sheet portion 141a of the first channel 141 may be 10 nm or less. For example, the thickness d of the sheet portion 141a of the first channel 141 may be 5 nm or less. For example, the thickness d of the sheet portion 141a of the first channel may be 1 nm or less. A distance between the source electrode 120 and the drain electrode 130 may be, for example, 100 nm or less. Alternatively, the distance between the source electrode 120 and the drain electrode 130 may be, for example, 50 nm or less. Alternatively, the distance between the source electrode 120 and the drain electrode 130 may be, for example, 20 nm or less.

A gate insulating layer 150 may be formed in the first channel 141 and the second channel 142. A gate electrode 160 may be formed in the gate insulating layer 150. When viewed in the first cross-section, the gate insulating layer 150 may be formed inside the first channel 141, and the gate electrode 160 may be formed inside the gate insulating layer 150.

When viewed in the first cross-section, the first channel 141 may surround the entire gate electrode 160. Accordingly, the gate electrode 160 may be surrounded by the entire inner surface of the first channel 141 with the gate insulating layer 150 interposed therebetween.

An insulating layer 170 may be further arranged between the first channels 141 adjacent to each other and between the first channel 141 and the second channel 142. The insulating layer 170 may be arranged to cross an area (e.g., extend) between the source electrode 120 and the drain electrode 130. The insulating layer 170 may directly contact the source electrode 120 and the drain electrode 130. The insulating layer 170 may insulate the channels from each other and may function as a support layer for depositing the channels in a manufacturing process to be described below. The insulating layer 170 may have a thickness of, for example, greater than 0 nm and less than or equal to 100 nm. For example, the insulating layer 170 may have a thickness of greater than 0 nm and less than or equal to 20 nm.

The insulating layer 170 may include at least one of low-doped silicon, $SiO_2$, $Al_2O_3$, $HfO_2$, or $Si_3N_4$.

In the present embodiment, the first channels 141 may have the hollow closed cross-sectional structure and may be connected between the source electrode 120 and the drain electrode 130, thereby forming a multi-bridge structure. In the substrate 110, the source electrode 120 and the drain electrode 130 may be arranged to be separated from each other in a first direction, and the first channel 141 may be arranged between the source electrode 120 and the drain electrode 130 to be separated from each other in a second direction perpendicular to the substrate 110. The first direction may be the X direction and the second direction may be the Z direction.

Referring to FIG. 3, the channels 140 may include the first channel 141 having the hollow closed cross-sectional structure when viewed in the second cross-section. A plurality of first channels 141 may be arranged and may be separated from each other. The gate insulating layer 150 may be arranged in the first channel 141, and the gate electrode 160 may be arranged in the gate insulating layer 150. When viewed in the first cross-section, the first channels 141 may be separated from each other in the height direction of the field effect transistor, that is, in the direction (Z direction) perpendicular to the substrate 110, the gate insulating layer 150 may be arranged on an outer side of the first channel 141, and the gate electrode 160 may surround the first channel 141. That is, the gate electrode 160 may surround all sides of the first channel 141, and this configuration may be referred to as an all-around gate structure. When viewed in both the first and second cross-sections, the first channel 141 in the first cross-section and the first channel 141 in the second cross-section may be alternately arranged in the direction perpendicular to the substrate 110.

The insulating layer 170 may be arranged inside the first channel 141.

As illustrated in FIG. 3, the gate insulating layer 150 may contact the first channel layer 141 and may surround the first channel layer 141 along a closed path. The gate electrode 160 may be separated from the first channel layer 141 with the gate insulating layer 150 interposed therebetween and may surround the first channel layer 141 along a closed path. The gate insulating layer 150 may insulate the first channel layer 141 and the gate electrode 160 from each other and may limit and/or suppress a leakage current.

The gate electrode 160 may include side portions 160sp, horizontal portions 160hp, and an upper portion 160up. A thickness of the upper portion 160up may be greater than a thickness of the horizontal portion 160hp. The horizontal portion 160hp may extend in spaces between the insulating layers 170 (or air gap 270 in FIG. 7). The horizontal portion 160hp may be separated from the insulating layers 170 by the gate insulating layer 150 and first channel layer 141.

Figure 4:
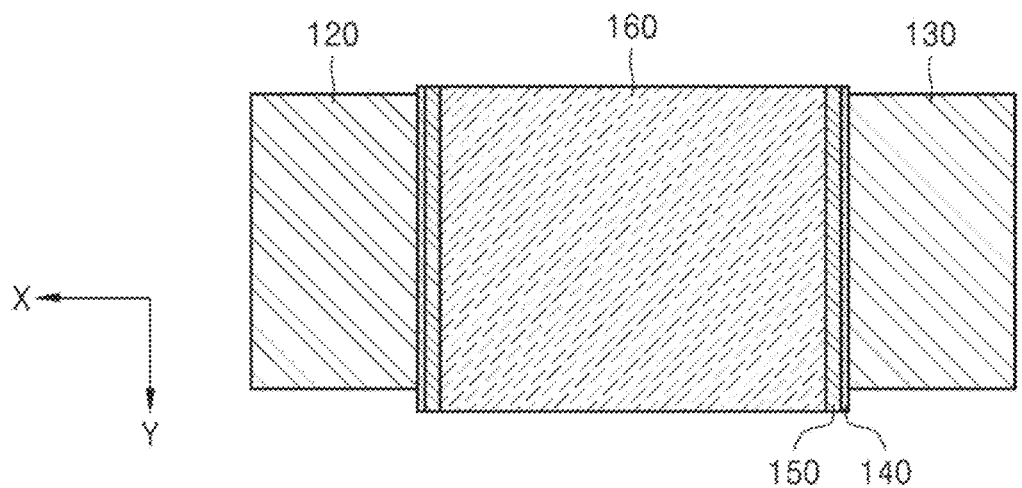
FIG. 4 is a plan view of FIG. 1.

FIG. 4 is a plan view of the field effect transistor 100 of FIG. 1. Referring to FIGS. 2, 3, and 4, the gate insulating layer 150 may extend to a region between the gate electrode 160 and the source electrode 120 and to a region between the gate electrode 160 and the drain electrode 130, to insulate the gate electrode 160 from the source electrode 120, and the gate electrode 160 from the drain electrode 190.

A contact between the first channel 141 and the source electrode 120 and a contact between the first channel 141 and the drain electrode 130 may have an edge shape. As illustrated in FIG. 2, the contact portions 141b extending in a third direction (Y direction) may be arranged at both sides of the first channel 141, and the contact portions 141b may contact the source electrode 120 and the drain electrode 130, respectively. The contact portions 141b may be in surface contact with the source electrode 120 and the drain electrode 130, respectively.

In the present embodiment, the gate electrode 160 may be arranged on one side of the first channel 141 with the gate insulating layer 150 interposed therebetween. That is, the insulating layer 170 may be arranged on one surface of the first channel 141, and the gate insulating layer 150 may be arranged on the other surface.

In the field effect transistor 100 according to an embodiment, the first channels 141 may arranged with the multi-bridge structure in which both sides thereof are in contact with the source electrode 120 and the drain electrode 130, respectively, and are separated from each other in a direction away from the substrate 110. Channels with the multi-bridge structure may reduce a short channel effect and reduce an area occupied by a source/drain, and thus may be advantageous for high integration. In addition, a source/drain junction capacitance may be maintained uniform regardless of position of the channels, and thus the channels may be applied to high-speed, high-reliability devices. Although FIG. 3 illustrates three channels configuring the multi-bridge structure, which is merely a non-limiting example, and the present disclosure is not limited thereto, and the field effect transistor 100 according to an embodiment may include a plurality of channels, for example, four or more channels stacked.

The first channel layer 141 of the field effect transistor 100 according to an embodiment may be formed of a two-dimensional semiconductor material. The two-dimensional semiconductor material refers to a semiconductor material having a two-dimensional crystal structure, and may have a monolayer or multilayer structure. Each of layers constituting the two-dimensional semiconductor material may have an atomic level thickness.

Figure 5:
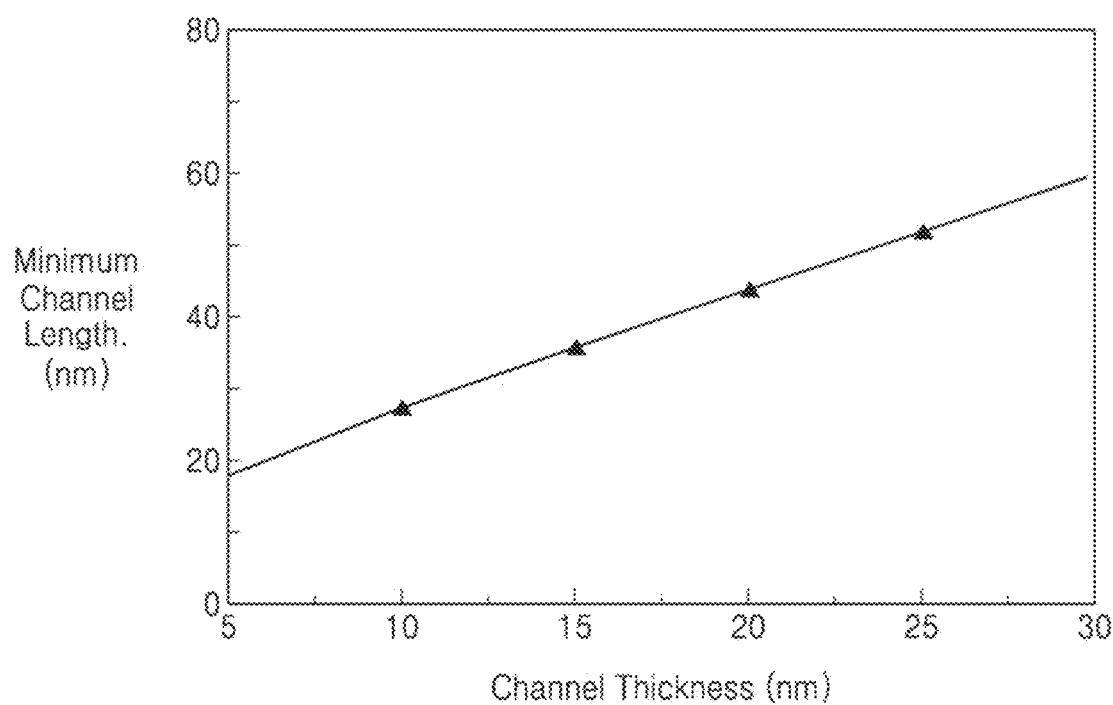
FIG. 5 is a graph conceptually illustrating variation of a minimum channel length due to a short channel effect with a channel thickness.

In the field effect transistor 100 according to an embodiment, the first channel layer 141 may include the two-dimensional semiconductor material to achieve a lower channel length. Here, a channel length CL may represent a channel length between the source electrode 120 and the drain electrode 130, that is, a length in the first direction (X direction) as shown in FIG. 2. FIG. 5 illustrates a change in a minimum channel length according to a channel thickness. Referring to FIG. 5, the channel length CL may be related to a thickness of the channel 141, and the channel length CL may be set to a minimum length determined by the thickness of the channel 141. The thickness may indicate a thickness in a channel stacking direction, that is, the Z direction. As the thickness of the channel 141 becomes lower, the channel length may be reduced, and accordingly the size of the field effect transistor may be reduced.

The thickness d of the sheet portion 141a of the first channel 141 may be 20 nm or less. Alternatively, the thickness d of the sheet portion 141a of the first channel 141 may be 5 nm or less. Alternatively, the thickness d of the sheet portion 141a of the first channel 141 may be 1 nm or less. The two-dimensional semiconductor material has excellent electrical characteristics and may be applied to various devices because its characteristics are not greatly changed and high mobility is maintained even with a nanoscale thickness.

The two-dimensional semiconductor material may include, for example, at least one of graphene, black phosphorous, and transition metal dichalcogenide (TMD). Graphene is a material having a hexagonal honeycomb structure in which carbon atoms are two-dimensionally bonded, has high electrical mobility and excellent thermal characteristics compared to those of silicon (Si), is chemically stable, and has a wide surface area. Black phosphorous is a material in which black phosphorous atoms are two-dimensionally bonded.

The TMD may include, for example, any one transition metal of Mo, W, Nb, V, Ta, Ti, Zr, Hf, Tc, and Re and any one chalcogen element of S, Se, and Te. The TMD may be represented by, for example, $MX_2$, where M represents the transition metal and X represents the chalcogen element. For example, M may be Mo, W, Nb, V, Ta, Ti, Zr, Hf, Tc, or Re, and X may be S, Se, or Te. Thus, for example, the TMD may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, etc. Alternatively, the TMD may not be represented by $MX_2$. In this case, for example, the TMD may include CuS that is a compound of a transition metal of Cu and a chalcogen element of S. Meanwhile, the TMD may be a chalcogenide material including a non-transition metal. The non-transition metal may include, for example, Ga, In, Sn, Ge, or Pb. In this case, the TMD may include a compound of a non-transition metal such as Ga, In, Sn, Ge, or Pb and a chalcogen element such as S, Se, or Te. For example, the TMD may include $SnSe_2$, GaS, GaSe, GaTe, GeSe, $In_2Se_3$, or $InSnS_2$.

As described above, the TMD may include any one metal element of Mo, W, Nb, V, Ta, Ti, Zr, Hf, Tc, Re, Cu, Ga, In, Sn, Ge, and Pb and one chalcogen element of S, Se, and Te. However, the above-mentioned materials are merely non-limiting examples, and other materials may be used for the TMD.

The two-dimensional semiconductor material may be doped with a p-type dopant or an n-type dopant to adjust mobility. Here, the p-type dopant and the n-type dopant may be, for example, a p-type dopant and an n-type dopant used in graphene or a carbon nanotube (CNT), respectively. The p-type dopant or the n-type dopant may be doped by an ion implantation or chemical doping method.

The first channels 141 may be formed of the same two-dimensional semiconductor material and may have the same thickness. However, the present disclosure is not limited thereto, and the first channels 141 may include different types of the two-dimensional semiconductor materials and may have different thicknesses. Alternatively, the first channels 141 may be separated from each other in a cross-sectional view, but may be connected to each other like a chain in an overall three-dimensional view.

The source electrode 120 and the drain electrode 130 may include a metal material having electrical conductivity. For example, the source electrode 120 and the drain electrode 130 may include a metal such as magnesium (Mg), aluminum (Al), scandium (Sc), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), tantalum (Ta), tungsten (W), iridium (Ir), platinum (Pt), gold (Au), bismuth (Bi), or an alloy thereof.

The gate electrode 160 may include a metal material or a conductive oxide. Here, the metal material may include at least one selected from the group consisting of Au, Ti, TIN, TaN, W, Mo, WN, Pt, and Ni. The conductive oxide may include, for example, indium tin oxide (ITO) or indium zinc oxide (IZO). Alternatively, the gate electrode 160 may be formed of the same material as those of the source electrode 120 and the drain electrode 130.

The gate insulating layer 150 may include a high-k dielectric material, that is, a material with a high dielectric constant. The gate insulating layer 150 may include, for example, aluminum oxide, hafnium oxide, zirconium hafnium oxide, lanthanum oxide, etc. However, it is not limited thereto.

The gate insulating layer 150 may include a ferroelectric material. Ferroelectric materials have spontaneous electric dipoles, that is, spontaneous polarization, as the charge distribution in a unit cell is non-centrosymmetric in a crystallized material structure. Therefore, ferroelectric materials have remnant polarization by dipoles even in an absence of an external electric field. In addition, the polarization direction may be switched in a domain unit by an external electric field. The ferroelectric material may include, for example, at least one oxide selected from Hf, Si, Al, Zr, Y, La, Gd, and Sr, but this is merely a non-limiting example. In some embodiments, the ferroelectric material may further include a dopant.

In the case where the gate insulating layer 150 includes the ferroelectric material, the field effect transistor 100 may be applied to a logic device or a memory device. In the case where the gate insulating layer 150 includes the ferroelectric material, a subthreshold swing (SS) may be reduced by a negative capacitance effect, and thus, the size of the field effect transistor 100 may be reduced while improving its performance.

The gate insulating layer 150 may have a multi-layer structure including a high-k material and the ferroelectric material. The gate insulating layer 150 may include a charge trapping layer, such as silicon nitride, and accordingly, the field effect transistor 100 may operate as a memory transistor having memory characteristics. For example, the gate insulating layer 150 may include a charge trapping layer between an insulating film and a tunneling layer formed of different dielectric materials than the charge trapping layer.

The field effect transistor 100 according to an embodiment may reduce the short channel effect and may have a low channel length, by forming the channels with the two-dimensional semiconductor material.

The short channel effect refers to a performance limitation that occurs when the channel length is low, for example, phenomena such as threshold voltage variation, carrier velocity saturation, and degradation of the subthreshold characteristics.

The short channel effect is known to be related to the channel thickness. FIG. 5 is a graph conceptually illustrating that a minimum channel length due to a short channel effect varies according to a channel thickness. As shown in the graph, the lower the channel thickness, the lower the implementable minimum channel length. Therefore, in order to implement a transistor that is highly miniaturized to increase the degree of integration, the channel length may be effectively reduced by reducing the channel thickness.

Meanwhile, in the case where the channel thickness is reduced by using a typical bulk material, for example, a silicon-based material and the channel thickness is several nm or less, the number of carriers within silicon is reduced, and thus electron mobility is lowered. In the field effect transistor 100 according to the present embodiment, by forming the channel layer 141 with the two-dimensional semiconductor material, high electron mobility may be maintained even in the case of the thickness of the channel layer 141 being several nm or less. Therefore, in the field effect transistor 100 of the present embodiment, the minimum channel length due to the short channel effect may be shortened, and excellent performance may be realized.

In addition, the field effect transistor 100 according to an example embodiment may have a gate all around structure in which the gate electrode surrounds four sides of the channel, and accordingly, a current may be more precisely adjusted and high power efficiency may be achieved. The field effect transistor according to an example embodiment may be applied to an electronic device requiring high performance and low power, such as a mobile device, an artificial intelligence (AI) device, 5G communication equipment, and an IoT device.

In the field effect transistor 100 according to an example embodiment, the contact area between the gate electrode and the channel may be further increased. Therefore, power consumption may be reduced and performance may be improved.

Figure 6:
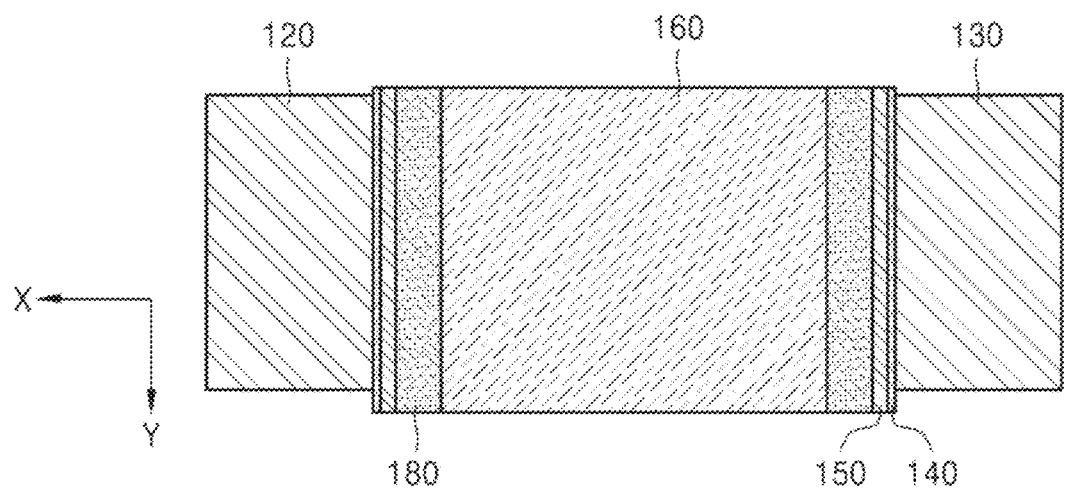
FIG. 6 is a plan view of a field effect transistor according to another example embodiment.

FIG. 6 illustrates an example in which a spacer is further included in the field effect transistor illustrated in FIG. 1. FIG. 6 is a plan view.

Referring to FIG. 6, spacers 180 may be further arranged between the source electrode 120 and the gate electrode 160, and between the drain electrode 130 and the gate electrode 160. The spacers 180 may be arranged to insulate the source electrode 120 from the gate electrode 160, and the drain electrode 130 from the gate electrode 160. The spacer 180 may include an insulating material. Although the gate insulating layer 150 may perform insulation, the spacers 180 may be further arranged to supplement the insulation of the gate insulating layer 150.

Figure 7:
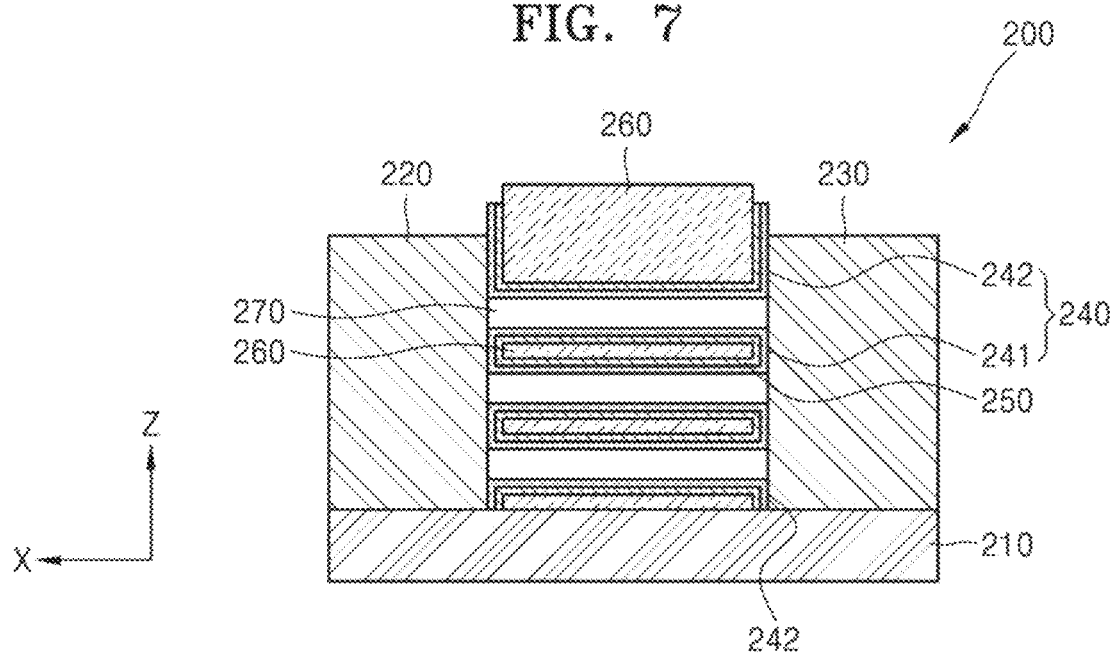
FIG. 7 is a cross-sectional view taken along line A-A of a field effect transistor according to another example embodiment.
Figure 8:
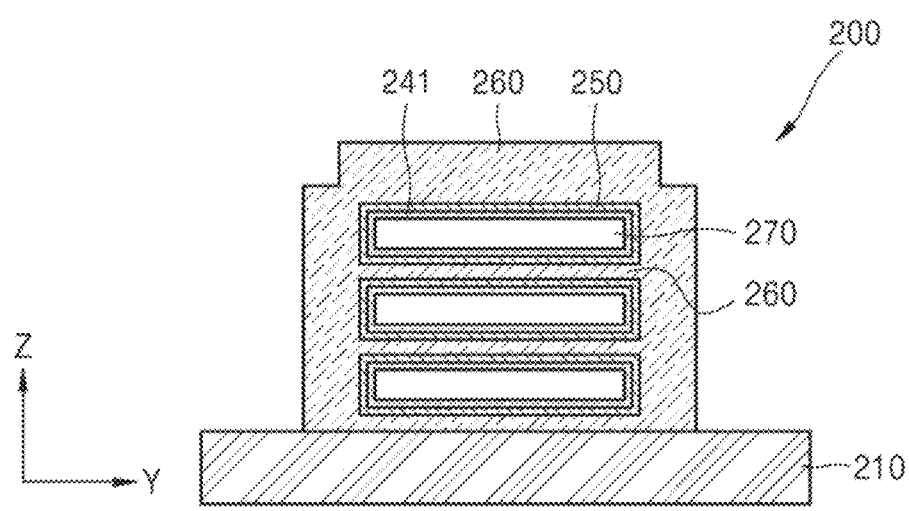
FIG. 8 is a cross-sectional view taken along a line B-B of a field effect transistor according to another example embodiment.

FIGS. 7 and 8 illustrate a field effect transistor according to another embodiment. FIG. 7 is a cross-sectional view taken along line A-A, and FIG. 8 is a cross-sectional view taken along line B-B, with respect to the field effect transistor. The A-A and B-B cross-sections are the same as described with reference to FIG. 1.

Referring to FIG. 7, a field effect transistor 200 may include a substrate 210, a source electrode 220 arranged on the substrate 210, a drain electrode 230 separated from the source electrode 220, channels 240 connected between the source electrode 220 and the drain electrode 230, and a gate electrode 260 insulated from the source electrode 220 and the drain electrode 230.

In the field effect transistor 200, components having the same names as those of the corresponding components of the field effect transistor 100 described with reference to FIGS. 1, 2, and 3 perform substantially the same functions and operations, and thus a detailed description thereof will be omitted and the differences will be mainly described.

Referring to FIGS. 7 and 8, the channels 240 may include a first channel 241 having a hollow closed cross-sectional structure when viewed in the first cross-section. The channels 240 may further include a second channel 242 having the open cross-sectional structure or the sheet-shaped structure. A plurality of first channels 241 may be arranged, and the first channels 241 may be separated from each other in the height direction (Z direction).

Meanwhile, the field effect transistor 200 may have an empty space 270 between the first channels 241 when viewed in the first cross-section. When viewed in the second cross-section, the empty space 270 may correspond to an interior of the first channel 241. The field effect transistor 200 may be manufactured by a gate first process in which the gate electrode is formed prior to forming of the source electrode and the drain electrode in a manufacturing operation that will be described later. In this process, the empty space 270 may be formed between the first channel 241 and the second channel 242 without being filled.

Hereinafter, a method of manufacturing a field effect transistor according to an example embodiment will be described.

In FIGS. 9 to 14, A-A sections (first cross-sections) and B-B sections (second cross-sections) are shown together in each drawing.

Figure 9:
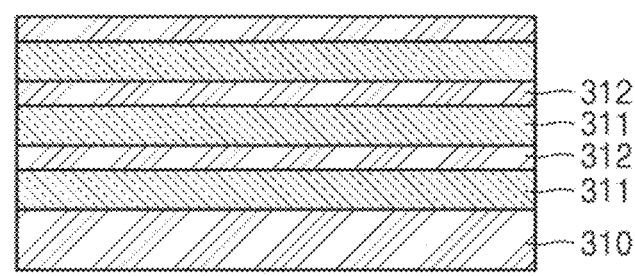
FIGS. 9 to 14 illustrate a method of manufacturing a field effect transistor according to an example embodiment.
Figure 9:
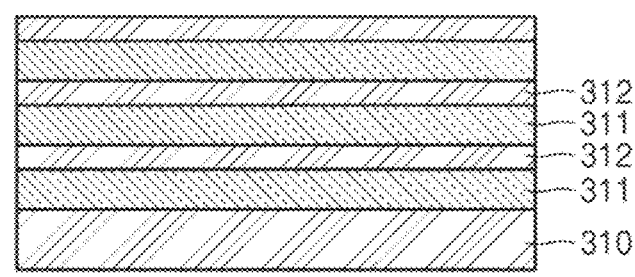

Referring to FIG. 9, sacrificial layers 311 and insulating layers 312 may be alternately stacked on a substrate 310. The substrate 310 may be an insulating substrate or a semiconductor substrate having an insulating layer formed thereon. The semiconductor substrate may include, for example, Si, Ge, SiGe or a group III-V semiconductor material. The substrate 310 may be, for example, a silicon substrate in which silicon oxide is formed on a surface thereof, but is not limited thereto. The sacrificial layer 311 and the insulating layer 312 may be formed of materials that may be selectively removed by using an etching gas or an etching solution. The sacrificial layer 311 may include an inorganic material such as $SiO_2$, $Al_2O_3$, $Si_3N_4$, poly-Si, or SiGe, or an organic material such as PMMA or PR. The insulating layer 312 may include at least one of low-doped silicon, $SiO_2$, $Al_2O_3$, $HfO_2$, or $Si_3N_4$.

Figure 10:
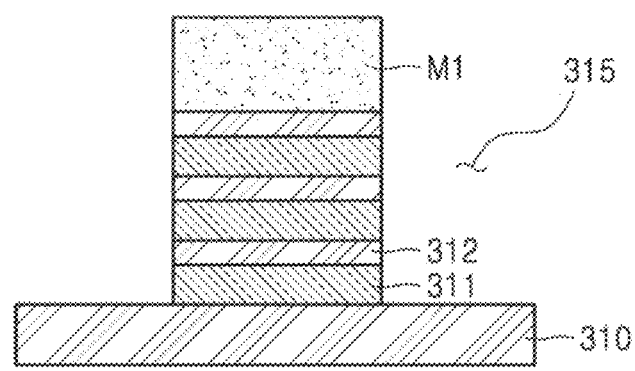
Figure 10:
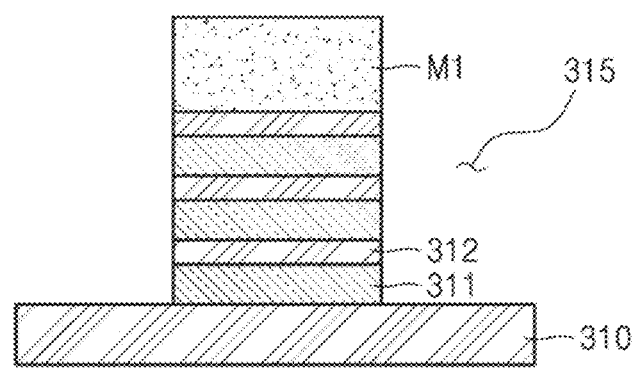

Referring to FIG. 10, a stack structure of the sacrificial layers 311 and the insulating layers 312 may be patterned by using a first mask M1. The first mask M1 may have a pattern corresponding to the source electrode and the drain electrode. The stack structure of the sacrificial layers 311 and the insulating layers 312 may be patterned by removing a portion of the stack structure by using the first mask M1. Electrode corresponding regions 315 may be formed at both sides of the patterned stacked structure.

Figure 11:
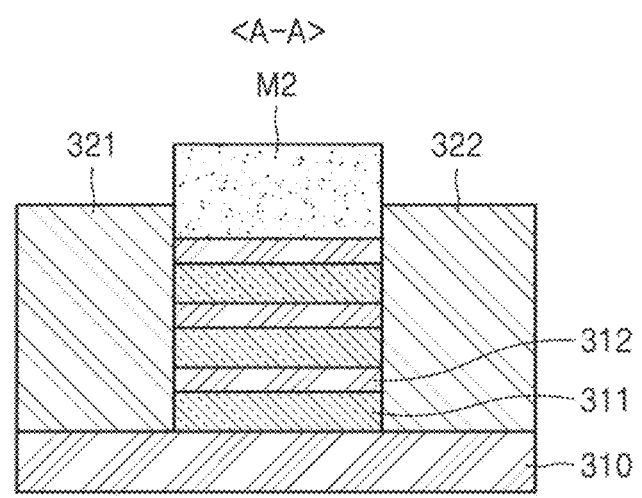
Figure 11:
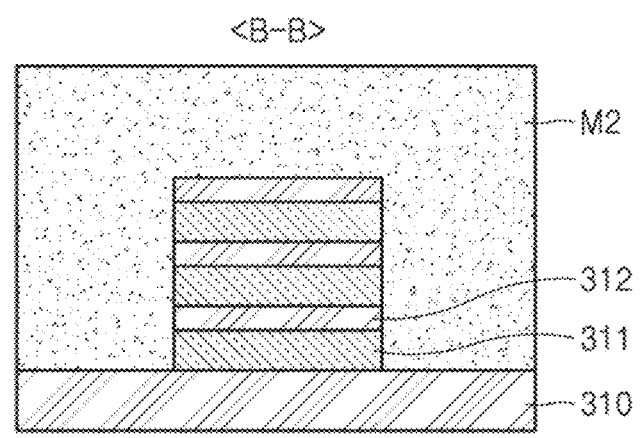

Referring to FIG. 11, a source electrode 321 and a drain electrode 322 may be formed at the electrode corresponding regions 315, respectively, by using a second mask M2. The source electrode 321 and the drain electrode 322 may be formed such that they appear in the first cross-section and does not appear in the second cross-section by being blocked by the second mask M2.

Figure 12:
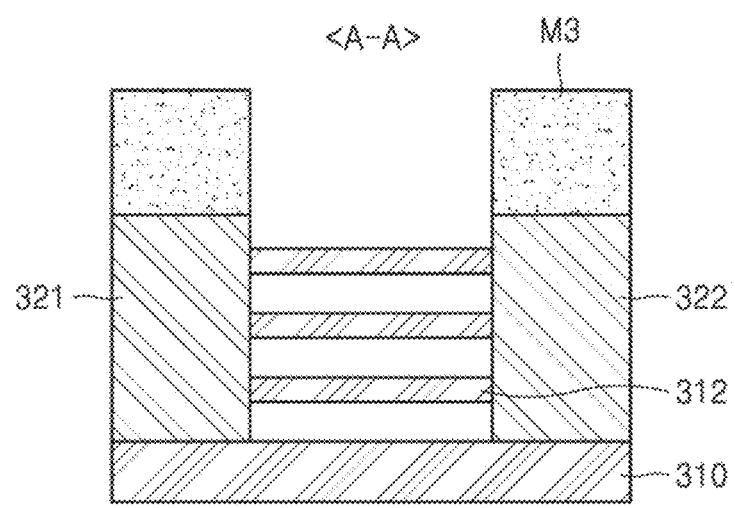
Figure 12:
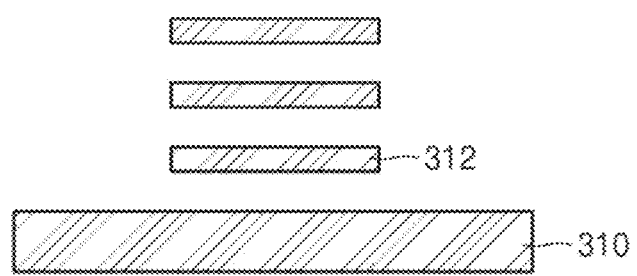

Referring to FIG. 12, third masks M3 may be formed on the source electrode 321 and the drain electrode 322. The sacrificial layers 311 may be removed by using the third masks M3 and an etching gas that selectively etches only the sacrificial layers 311, and the insulating layers 312 may remain. The insulating layers 312 may be connected between the source electrode 321 and the drain electrode 322, and the insulating layers 312 may be stacked to be separated from each other in a multi-bridge configuration. The insulating layers 312 may be suspended between the source electrode 321 and the drain electrode 322.

Figure 13:
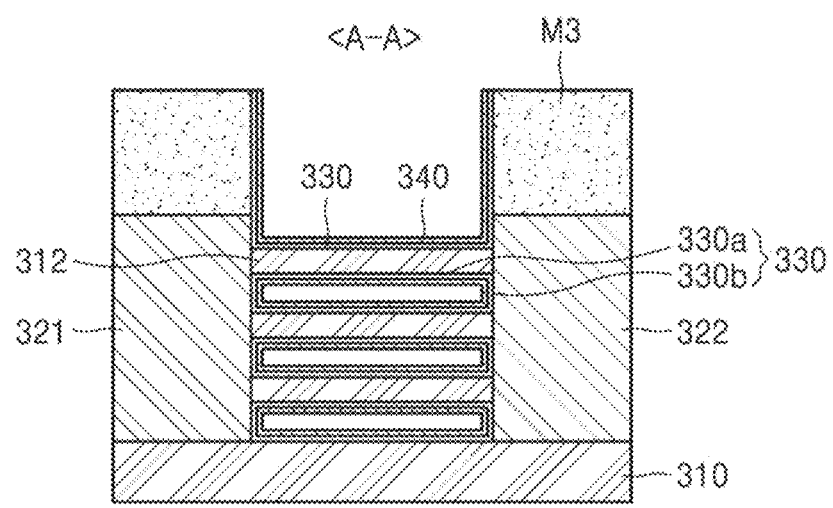
Figure 13:
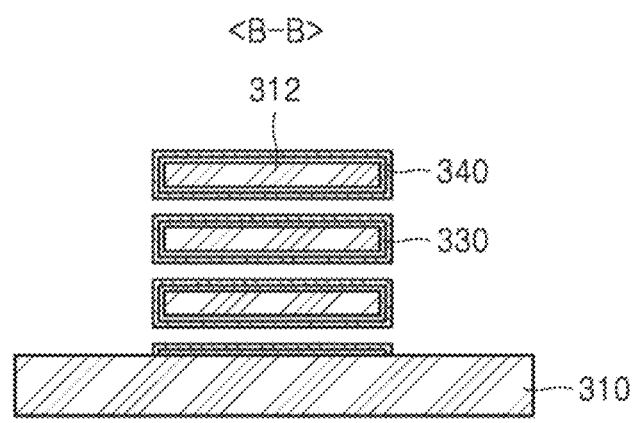

Referring to FIG. 13, channels 330 may be formed by depositing a channel material on the insulating layers 312, the source electrode 321, and the drain electrode 322. The channel 330 may be formed by chemical vapor deposition (CVD), metal organic chemical vapor deposition (MOCVD), or atomic layer deposition (ALD). The channel 330 may be formed of, for example, the two-dimensional semiconductor material. The two-dimensional semiconductor material may include graphene, black phosphorus, phosphorene, or transition metal dichalcogenide. The two-dimensional semiconductor material may be deposited with a thickness of several nanometers. Although it is difficult to form the channel with a two-dimensional material due to the significantly low thickness of the channel, the two-dimensional material may be easily deposited thinly by forming the channel 330 on the insulating layer 312 as in the present embodiment. The insulating layers 312 may support the channels 330.

The channels 330 may be connected to the source electrode 321 and the drain electrode 322 and may have the hollow closed cross-sectional structure, when viewed in the first cross-section. The channel 330 may include a sheet portion 330a that is connected between the source electrode 321 and the drain electrode 322, and a contact portion 330b that contacts the source electrode 321 and the drain electrode 322 and supports the sheet portion 330a to have a gap therebetween. When viewed in the second cross-section, the channels 330 may be connected to the source electrode 321 and the drain electrode 322 and may have the hollow closed cross-sectional structure.

A gate insulating layer 340 may be deposited on the channel 330. The gate insulating layer 340 may be formed by CVD, MOCVD, or ALD.

Figure 14:
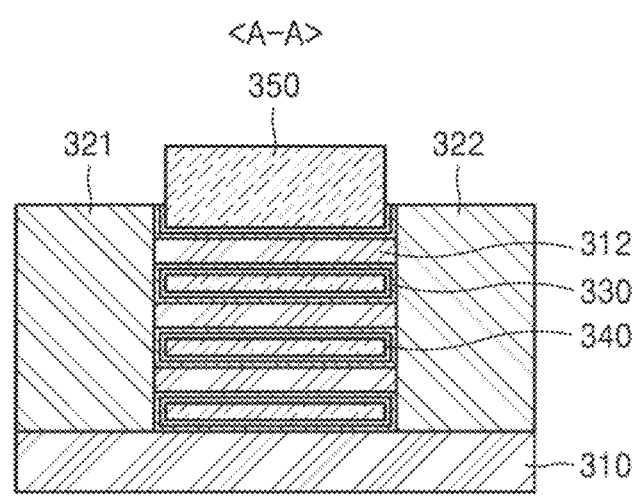
Figure 14:
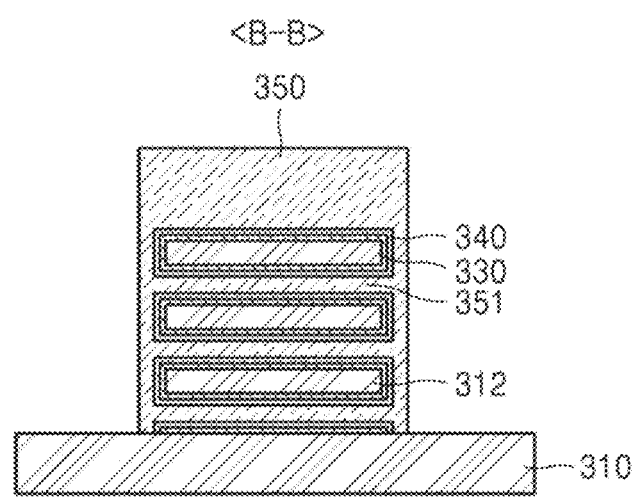

Referring to FIG. 14, the gate electrode 350 may be formed on the gate insulating layers 340, and then the third mask M3 may be removed. The gate electrode 350 may include horizontal portions 351 that extend between the source electrode 321 and drain electrode 322 and are spaced apart from each other in a vertical direction.

The method of manufacturing a field effect transistor described with reference to FIGS. 9 to 14 employs a gate last process in which the gate electrode 350 is formed later than manufacturing of the source electrode 321 and the drain electrode 322. In the present embodiment, the insulating layers 312 may be formed between the source electrode 321 and the drain electrode 322, and the channels 330 may be easily formed in the insulating layers 312.

FIGS. 15 to 20 illustrate a method of manufacturing a field effect transistor according to another example embodiment.

In FIGS. 15 to 20, A-A sections (first cross-sections) and B-B sections (second cross-sections) are shown together in each drawing.

Figure 15:
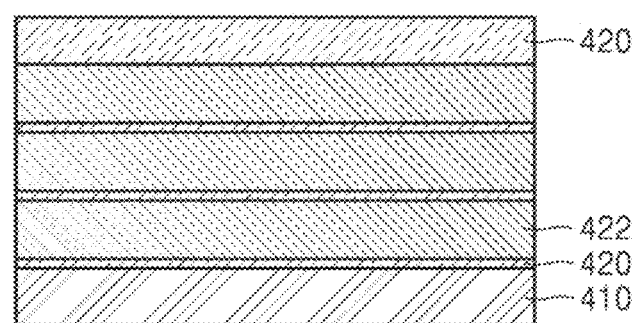
FIGS. 15 to 20 illustrate a method of manufacturing a field effect transistor according to another example embodiment.
Figure 15:
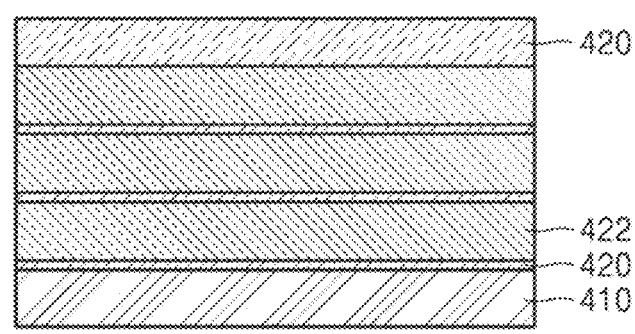

Referring to FIG. 15, gate electrodes 420 and sacrificial layers 422 may be alternately stacked on a substrate 410. The sacrificial layer 422 may include an inorganic material such as $SiO_2$, $Al_2O_3$, $Si_3N_4$, poly-Si, or SiGe, or an organic material such as PMMA or PR.

Figure 16:
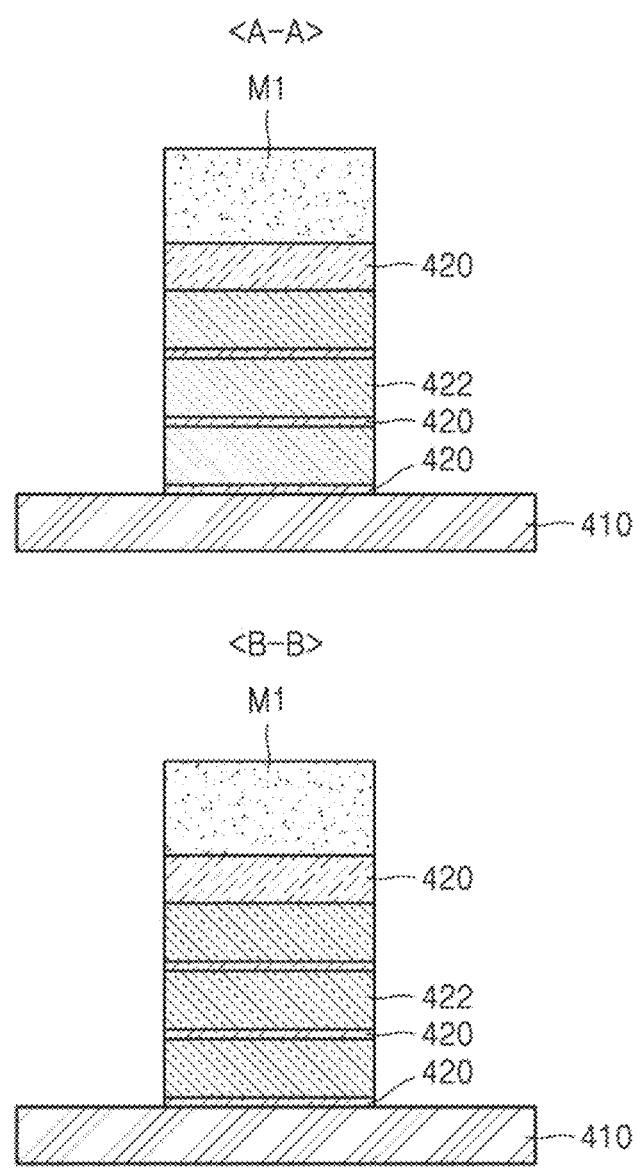

Referring to FIG. 16, a stack structure of the gate electrodes 420 and the sacrificial layers 422 may be patterned, and a portion of the stack structure may be removed by using a first mask M1.

Figure 17:
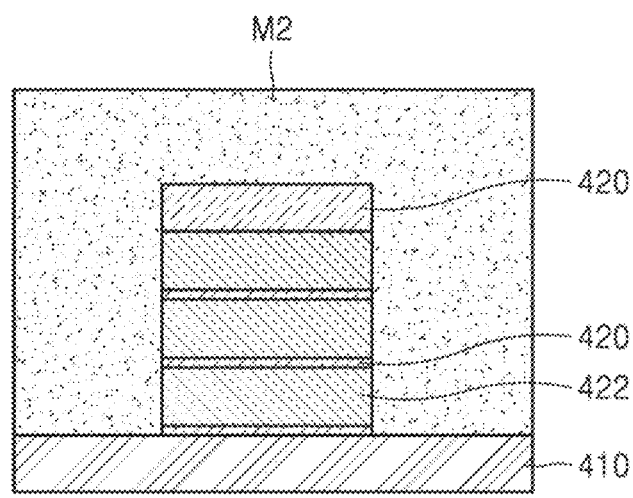
Figure 17:
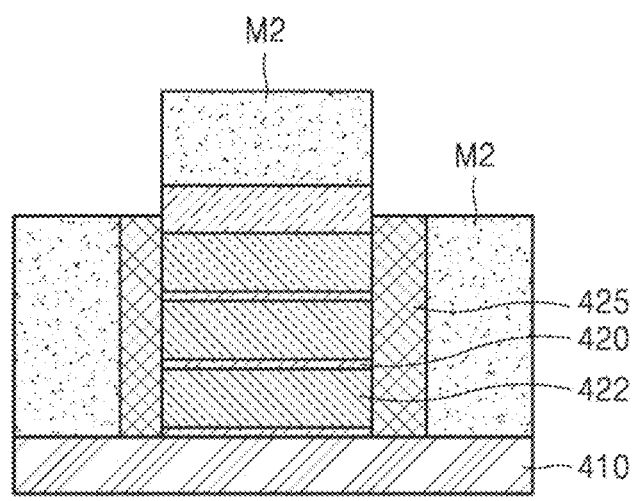

Referring to FIG. 17, gate support electrodes 425 may be formed at both sides of the patterned stack structure by using a second mask M2. The gate support electrodes 425 may support the gate electrodes 420 that remains after the sacrificial layers 422 are removed. The gate support electrode 425 may be formed of the same material as that of the gate electrode 420. However, the gate support electrode 425 is not limited thereto, and may include a conductive material. The gate support electrode 425 may operate as an electrode together with the gate electrode 420.

Figure 18:
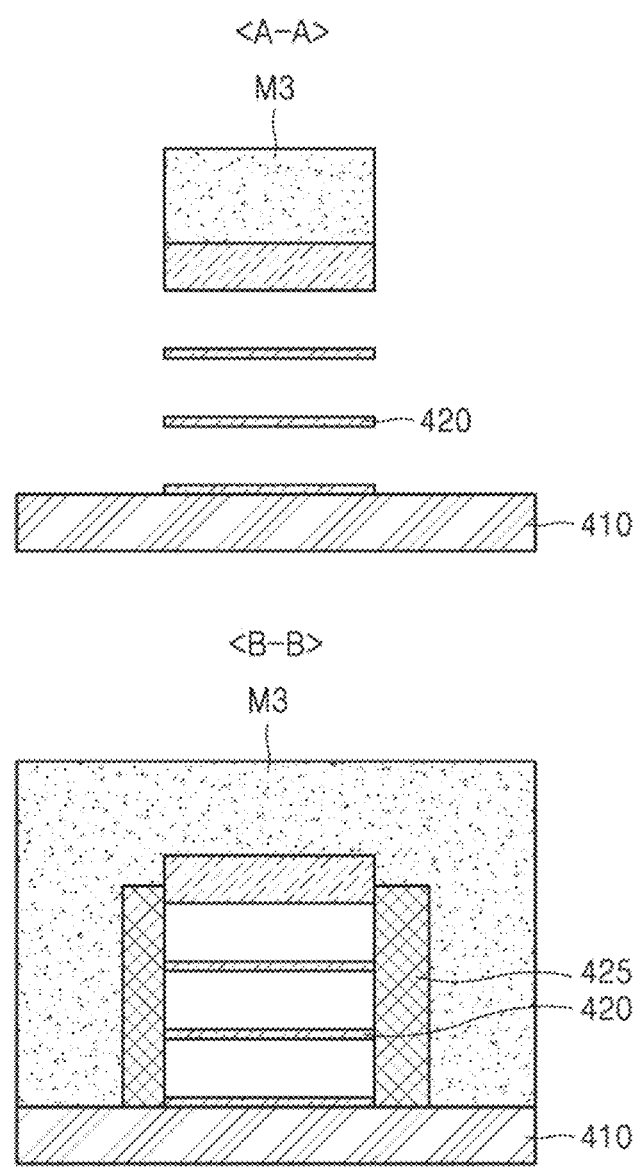

Referring to FIG. 18, the sacrificial layers 422 may be removed and the gate electrodes 420 may remain. The gate electrodes 420 may be connected to and supported by the gate support electrodes 425 and may be stacked to be separated from each other in the multi-bridge configuration. The gate electrodes 420 may be suspended from the gate support electrodes 425. A third mask M3 may be arranged around the gate electrodes 420. The third mask M3 may define a channel region, a source electrode region, and a drain electrode region. Electrode corresponding regions 415 may be formed at both sides of the patterned stack structure when viewed in the first cross-section.

Figure 19:
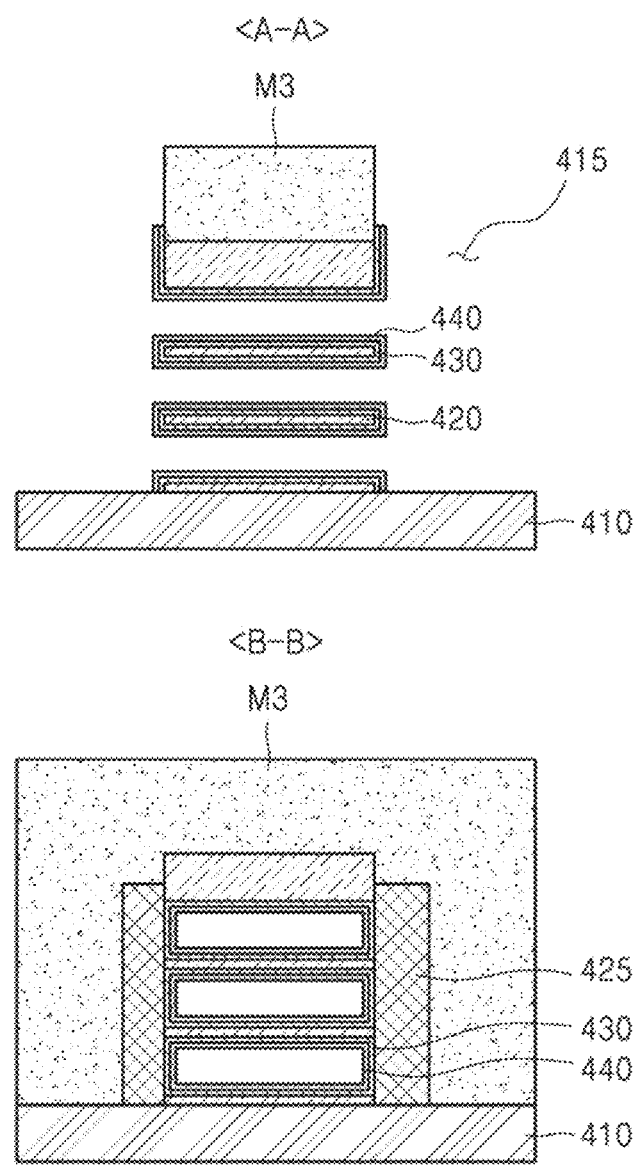

Referring to FIG. 19, a gate insulating layer 430 may be deposited on the gate electrode 420 by using the third mask M3. A channel material may be deposited on the gate insulating layer 430 to form a channel 440. The channel 440 may include the two-dimensional semiconductor material. Although it is difficult to form the channel 440 with the two-dimensional material due to the significantly low thickness of the channel, the two-dimensional material may be easily deposited thinly by forming the channel 440 on the gate electrode 420 as in the present embodiment. The gate electrodes 420 may support the channels 440.

Figure 20:
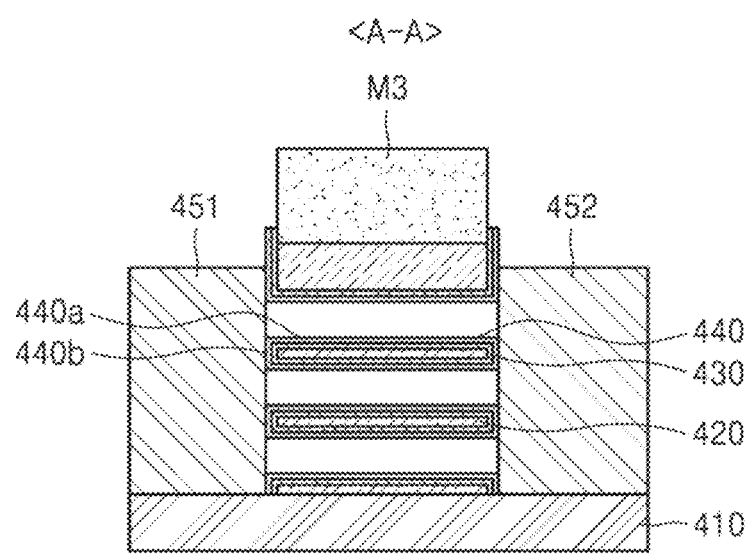
Figure 20:
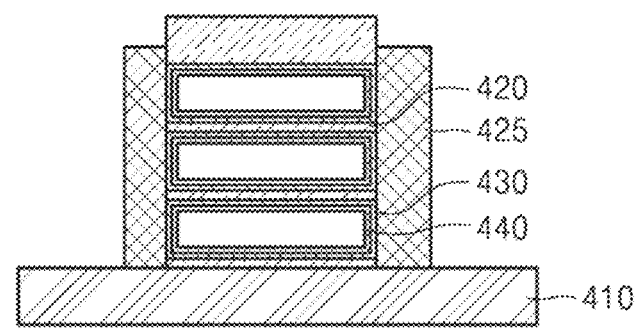

Referring to FIGS. 19 and 20, a source electrode 451 and a drain electrode 452 may be formed in the electrode corresponding regions 415, respectively. The source electrode 451 and the drain electrode 452 may be formed such that they appear in the first cross-section and does not appear in the second cross-section by being blocked by the third mask M2. After the source electrode 451 and the drain electrode 452 are formed, the third mask M3 may be removed to manufacture the field effect transistor.

In the present embodiment, the channels 440 may be connected to the source electrode 451 and the drain electrode 452 and may have the hollow closed cross-sectional structure, when viewed in the first and second cross-sections. The channel 440 may include a sheet portion 440a between the source electrode 451 and the drain electrode 452, and a contact portion 440b that contacts the source electrode 451 and the drain electrode 452 and supports the sheet portion 440a to have a gap therebetween. When viewed in the second cross-section, the channels 440 may be connected to the source electrode 451 and the drain electrode 452 and may have the hollow closed cross-sectional structure.

The method of manufacturing a field effect transistor described with reference to FIGS. 15 to 20 employs the gate first process in which the gate electrode 420 is formed prior to forming of the source electrode 451 and the drain electrode 452. In the present embodiment, the gate electrodes 420 may be formed between the gate support electrodes 425, and the gate insulating layers 430, and the channels 440 may be easily formed on the gate electrodes 420.

Figure 21:
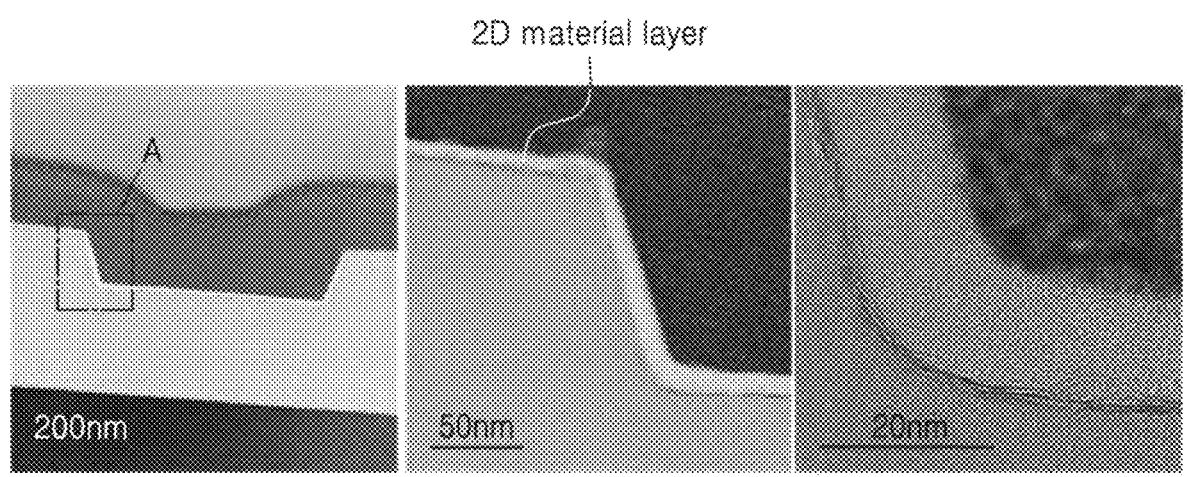
FIG. 21 illustrates a result of depositing a $MoS_2$ material on a three-dimensional structure.

FIG. 21 illustrates the deposition of a two-dimensional material of $MoS_2$ on a three-dimensional structure by MOCVD. In the enlarged view of portion A, a two-dimensional material layer is uniformly deposited.

The field effect transistor according to an example embodiment may include the channels in the multi-bridge configuration, thereby limiting and/or suppressing the short channel effect and effectively reducing the thickness and length of the channels. The method of manufacturing a field effect transistor according to an example embodiment may easily form significantly thin channels having a thickness of several nm or less.

The field effect transistor according to an example embodiment is highly miniaturized and has excellent electrical performance, and thus is suitable for an integrated circuit device having high integration.

The field effect transistor according to an example embodiment may constitute transistors that form a digital circuit or an analog circuit. In some embodiments, the field effect transistor may be used as a high-voltage transistor or a low-voltage transistor. For example, the field effect transistor according to an example embodiment may constitute high-voltage transistors that forms a peripheral circuit of a flash memory device, which is a non-volatile memory device operating at a high voltage, or an electrically erasable and programmable read only memory (EEPROM) device. Alternatively, according to an example embodiment, a transistor included in an IC device for a liquid crystal display (LCD) requiring an operating voltage of 10 V or more, for example, an operating voltage of 20 V to 30 V, or an IC chip used in a plasma display panel (PDP) requiring an operating voltage of 100 V, may be formed.

Figure 22:
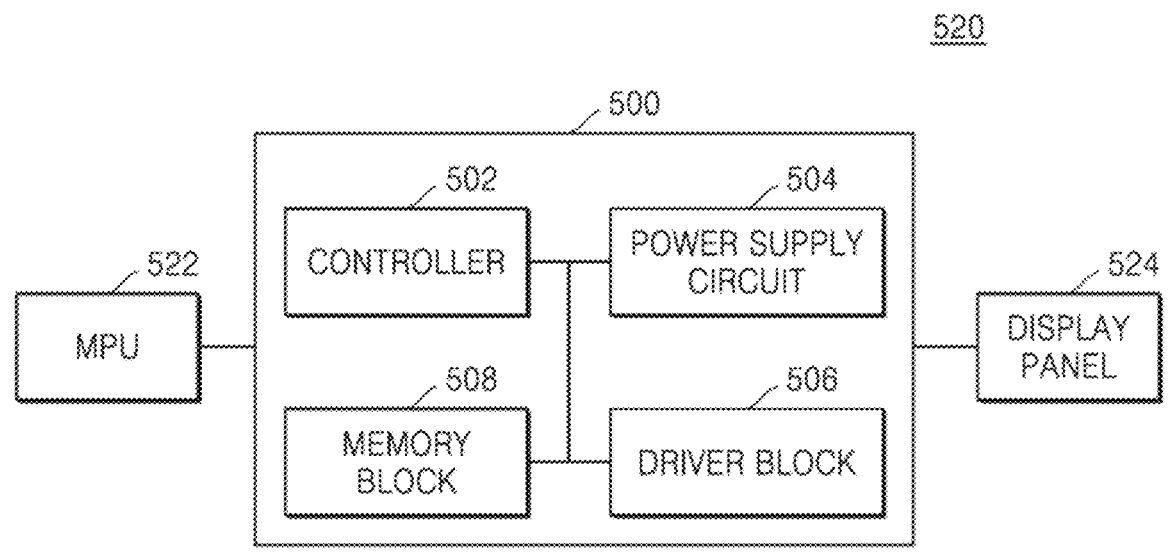
FIG. 22 is a schematic block diagram of a display driver integrated circuit (DDI) including a field effect transistor according to an example embodiment, and a display device including the DDI.

FIG. 22 is a schematic block diagram of a display driver integrated circuit (DDI) 500 according to an example embodiment, and a display device including the DDI 500.

Referring to FIG. 22, the DDI 500 may include a controller 502, a power supply circuit 504, a driver block 506, and a memory block 508. The control unit 502 may receive and decode a command applied from a main processing unit (MPU) 522, and control each block of the DDI 500 to implement an operation according to the command. The power supply circuit 504 may generate a driving voltage in response to control by the controller 502. The driver block 506 may drive a display panel 524 by using the driving voltage generated by the power supply circuit 504 in response to the control by the controller 502. The display panel 524 may be a liquid crystal display panel, OLED display panel, or a plasma display panel. The memory block 508 may temporarily store the command input to the controller 502 or control signals output from the controller 502, or may store necessary data, and may include memory such as RAM or ROM. The power supply circuit 504 and the driver block 506 may include the field effect transistor according to an example embodiment described above with reference to FIGS. 1 to 20.

Figure 23:
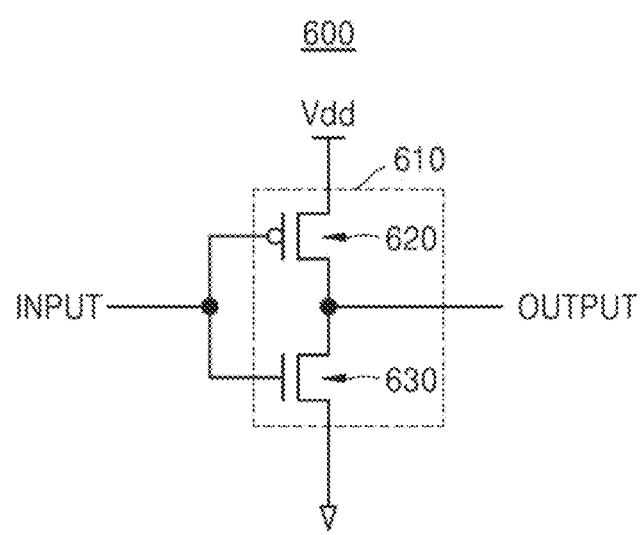
FIG. 23 is a circuit diagram of a CMOS inverter including a field effect transistor according to an example embodiment.

FIG. 23 is a circuit diagram of a CMOS inverter 600 according to an example embodiment.

The CMOS inverter 600 may include a CMOS transistor 610. The CMOS transistor 610 may include a PMOS transistor 620 connected between a power supply terminal Vdd and a ground terminal, and an NMOS transistor 630. The CMOS transistor 610 may include the field effect transistor according to an example embodiment described above with reference to FIGS. 1 to 21.

Figure 24:
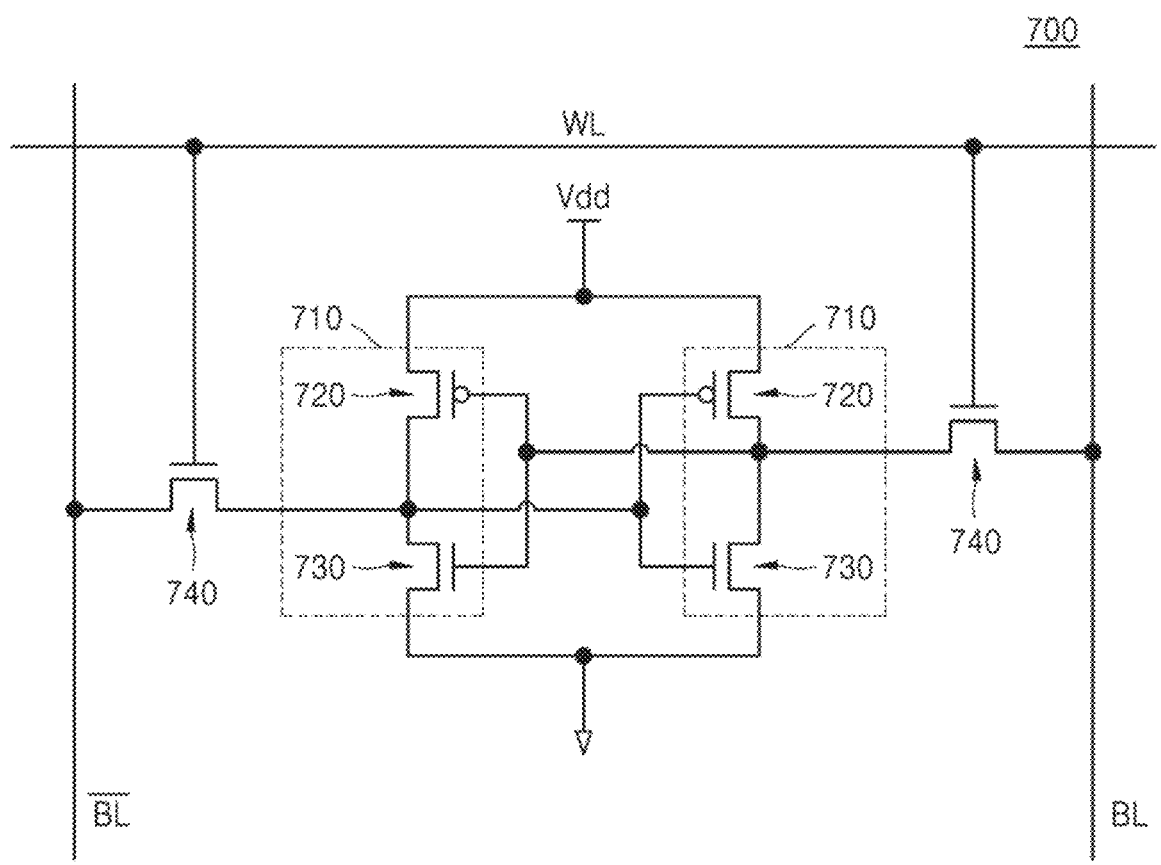
FIG. 24 is a circuit diagram of a CMOS SRAM device including a field effect transistor according to an example embodiment.

FIG. 24 is a circuit diagram of a CMOS SRAM device 700 according to an example embodiment.

The CMOS SRAM device 700 may include a pair of driving transistors 710. Each of the pair of driving transistors 710 may include a PMOS transistor 720 connected between a power terminal Vdd and a ground terminal, and an NMOS transistor 730. The CMOS SRAM device 700 may further include a pair of transfer transistors 740. A source of the transfer transistor 740 may be cross-connected to a common node of the PMOS transistor 720 and the NMOS transistor 730 constituting the driving transistor 710. The power terminal Vdd may be connected to sources of the PMOS transistors 720, and the ground terminal may be connected to sources of the NMOS transistors 730. A word line WL may be connected to gates of the pair of transfer transistors 740, and a bit line BL and an inverted bit line may be connected to drains of the pair of transfer transistors 740, respectively.

At least one of the driving transistors 710 and the transfer transistors 740 of the CMOS SRAM device 700 may include the field effect transistor according to an example embodiment described with reference to FIGS. 1 to 21.

Figure 25:
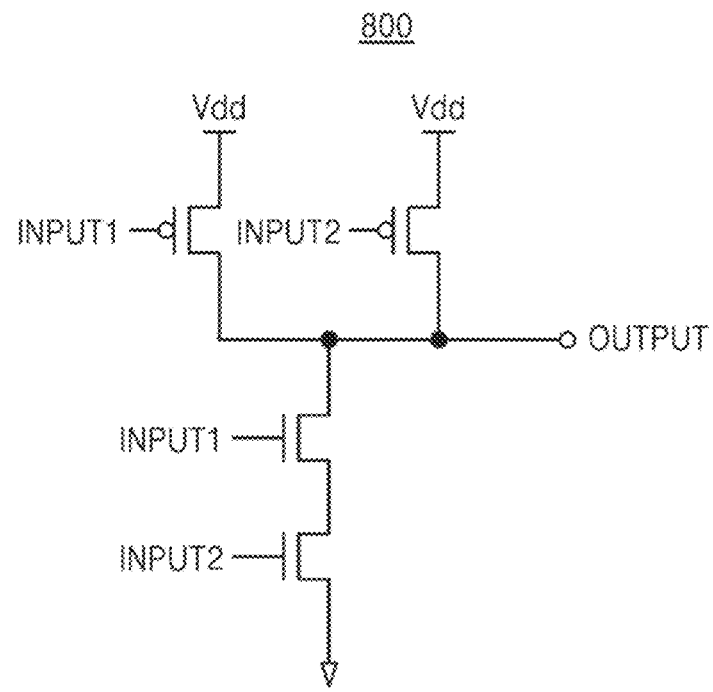
FIG. 25 is a circuit diagram of a CMOS NAND circuit including a field effect transistor according to an example embodiment.

FIG. 25 is a circuit diagram of a CMOS NAND circuit 800 according to an example embodiment.

The CMOS NAND circuit 800 may include a pair of CMOS transistors to which different input signals are transmitted. The CMOS NAND circuit 800 may include a field effect transistor according to an example embodiment described above with reference to FIGS. 1 to 21.

Figure 26:
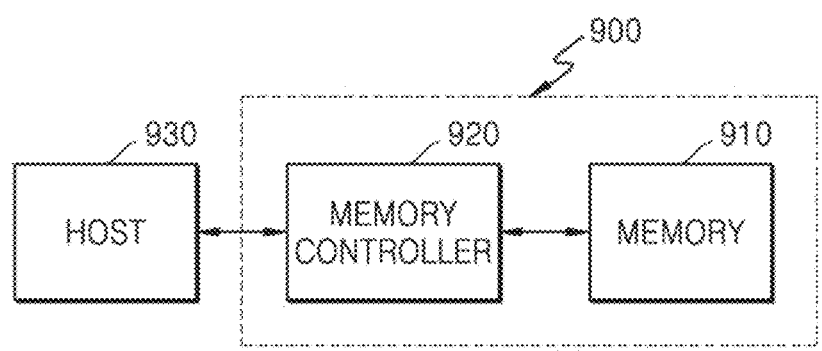
FIG. 26 is a block diagram of an electronic system including a field effect transistor according to an example embodiment.

FIG. 26 is a block diagram illustrating an electronic system 900 according to an example embodiment.

The electronic system 900 may include memory 910 and a memory controller 920. The memory controller 920 may control the memory 910 to read data from the memory 910 and/or to write data to the memory 910 in response to a request of a host 930. At least one of the memory 910 and the memory controller 920 may include the field effect transistor according to an example embodiment described above with reference to FIGS. 1 to 21.

Figure 27:
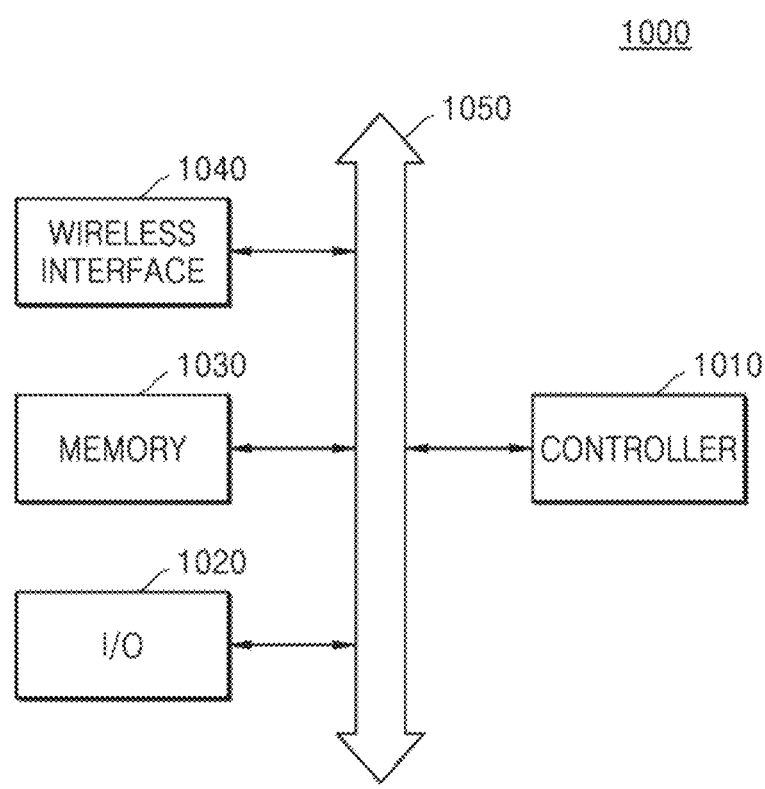
FIG. 27 is a block diagram of an electronic system including a field effect transistor according to an example embodiment.

FIG. 27 is a block diagram of an electronic system 1000 according to an example embodiment.

The electronic system 1000 may constitute a wireless communication device or a device capable of transmitting and/or receiving information under a wireless environment. The electronic system 1000 may include a controller 1010, an input/output (I/O) device 1020, memory 1030, and a wireless interface 1040, which are connected to each other through a bus 1050.

The controller 1010 may include at least one of a microprocessor, a digital signal processor, or a processing device similar thereto. The input/output device 1020 may include at least one of a keypad, a keyboard, or a display. The memory 1030 may store commands executed by the controller 1010. For example, the memory 1030 may store user data. The electronic system 1000 may use the wireless interface 1040 to transmit/receive data via a wireless communication network. The wireless interface 1040 may include an antenna and/or a wireless transceiver. In some embodiments, the electronic system 1000 may be used for a third generation communication system, for example, code division multiple access (CDMA), global system for mobile communications (GSM), north American digital cellular (NADC), extendedtime division multiple access (E-TDMA), and/or a communication interface protocol for the third generation communication system, for example, wide band code division multiple access (WCDMA). The electronic system 1000 may include the field effect transistor according to an example embodiment described above with reference to FIGS. 1 to 21.

The field effect transistor according to an example embodiment may be highly miniaturized and may exhibit good electrical performance, thus may be applied to an integrated circuit device, and may realize a small size, low power consumption, and high performance.

The field effect transistor according to an example embodiment may include the channels with the multi-bridge configuration to reduce line widths and increase a current amount. The field effect transistor according to an example embodiment may include the channel formed of the two-dimensional material to increase electron mobility, and may have a structure in which the gate electrode surround the entire channel thereby increasing gate controllability.

The method of manufacturing a field effect transistor according to an example embodiment may facilitate manufacturing of thin channels.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A field effect transistor comprising:
a substrate;
a source electrode on the substrate;
a drain electrode separated from the source electrode in a first direction;
channels between the source electrode and the drain electrode, the channels being connected to the source electrode and the drain electrode,
the channels having a hollow closed cross-sectional structure when viewed in a first cross-section formed by a plane across the source electrode and the drain electrode in a direction perpendicular to the substrate;
gate insulating layers inside the channels, the gate insulating layers having a hollow closed cross-sectional structure when viewed in the first cross-section; and
a gate electrode insulated from the source electrode and the drain electrode by the gate insulating layers,
wherein an inside surface of the channels contacts the gate insulating layers.

2. The field effect transistor of claim 1, wherein at least one of the channels includes a two-dimensional semiconductor material.

3. The field effect transistor of claim 2, wherein the two-dimensional semiconductor material includes graphene, black phosphorus, phosphor, or a transition metal dichalcogenide.

4. The field effect transistor of claim 3, wherein the transition metal dichalcogenide includes a metal element and a chalcogen element,
the metal element includes one of Mo, W, Nb, V, Ta, Ti, Zr, Hf, Tc, Re, Cu, Ga, In, Sn, Ge, and Pb, and
the chalcogen element includes one of S, Se, and Te.

5. The field effect transistor of claim 2, wherein the two-dimensional semiconductor material is doped with a conductive dopant.

6. The field effect transistor of claim 1, wherein the channels directly contact the source electrode and the drain electrode.

7. The field effect transistor of claim 1, further comprising:
an insulating layer between the channels adjacent to each other.

8. The field effect transistor of claim 7, wherein the insulating layer crosses an area between the source electrode and the drain electrode.

9. The field effect transistor of claim 7, wherein the insulating layer includes at least one of low-doped silicon, $SiO_2$, $Al_2O_3$, $HfO_2$, or $Si_3N_4$.

10. The field effect transistor of claim 1, wherein the channels are separated from each other in the direction perpendicular to the substrate.

11. The field effect transistor of claim 1, wherein a region between the channels adjacent to each other is an empty space.

12. The field effect transistor of claim 1, wherein a thickness of a sheet portion of at least one of the channels is about 10 nm or less.

13. The field effect transistor of claim 1, wherein the channels have the hollow closed cross-sectional structure when viewed in a second cross-section formed by a plane between the source electrode and the drain electrode in the direction perpendicular to the substrate.

14. The field effect transistor of claim 1, wherein the gate electrode is inside the channels when viewed in the first cross-section.

15. The field effect transistor claim 1, wherein
the channels each include a sheet portion extending parallel to an upper surface of the substrate and a contact portion extending in a direction perpendicular to the upper surface of the substrate, and
each corresponding gate insulating layer in a corresponding channel, among the gate insulating layers in the channels, covers the sheet portion and the contact portion of the corresponding channel without being spaced apart from the sheet portion and the contact portion of the corresponding channel.

16. A field effect transistor comprising:
a substrate;
a source electrode on the substrate;
a drain electrode separated from the source electrode;
a gate electrode on the substrate between the source electrode and the drain electrode;
a plurality of channels on the substrate between the source electrode and the drain electrode, the plurality of channels including first channels spaced apart from each other in a vertical direction, each of the first channels having a hollow cross- section; and a gate insulating layer connected to the gate electrode and the plurality of channels, the gate insulating layer insulating the gate electrode from the source electrode, the plurality of channels, and the drain electrode, the gate electrode surrounds all sides of the first channels when viewed in the hollow cross-section, and an inside surface of the first channels contacts the gate insulating layers.

17. The field effect transistor of claim 16, wherein the gate electrode is separated from the first channels in a distance parallel to an upper surface of the substrate by a distance corresponding to a thickness of the gate insulating layer in the distance parallel to the upper surface of the substrate, and the gate electrode is separated from the first channels in a distance perpendicular to the upper surface of the substrate by a distance corresponding to a thickness of the gate insulating layer in the distance perpendicular to the upper surface of the substrate.

18. The field effect transistor of claim 16, wherein the drain electrode is separated from the source electrode in a first direction, and a distance in the first direction between the gate electrode and the source electrode corresponds to a sum of a thickness in the first direction of the gate insulating layer and a thickness in the first direction of one of the plurality of channels.

19. A field effect transistor comprising:

a substrate;

a source electrode on the substrate;

a drain electrode separated from the source electrode in a first direction;

channels between the source electrode and the drain electrode, the channels being connected to the source electrode and the drain electrode, the channels having a hollow closed cross-sectional structure when viewed in a first cross-section formed by a plane across the source electrode and the drain electrode in a direction perpendicular to the substrate;

gate insulating layers inside the channels, the gate insulating layers having a hollow closed cross-sectional structure when viewed in the first cross-section; and a gate electrode insulated from the source electrode and the drain electrode by the gate insulating layer, wherein the gate electrode surrounds all sides of the channels when viewed in a second cross-section formed by a plane between the source electrode and the drain electrode in the direction perpendicular to the substrate, wherein the drain electrode is separated from the source electrode in the first direction, and a distance in the first direction between the gate electrode and the source electrode corresponds to a sum of a thickness in the first direction of one of the gate insulating layers and a thickness in the first direction of one of the channels.

* * * * *